(12) United States Patent
Zink et al.

(10) Patent No.: US 8,945,310 B2
(45) Date of Patent: Feb. 3, 2015

(54) METHOD AND DEVICE FOR CLEANING AT LEAST ONE OPTICAL COMPONENT

(75) Inventors: Peter Zink, Aachen (DE); Joseph Robert Rene Pankert, Aachen (DE); Guenther Hans Derra, Aachen (DE); Achim Weber, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 2723 days.

(21) Appl. No.: 10/557,384

(22) PCT Filed: May 18, 2004

(86) PCT No.: PCT/IB2004/050734
§ 371 (c)(1),
(2), (4) Date: Sep. 29, 2010

(87) PCT Pub. No.: WO2004/104707
PCT Pub. Date: Dec. 2, 2004

(65) Prior Publication Data
US 2011/0048452 A1 Mar. 3, 2011

(30) Foreign Application Priority Data
May 22, 2003 (EP) .................................. 03101475

(51) Int. Cl.
*B08B 7/00* (2006.01)
*G21K 1/06* (2006.01)
*B82Y 10/00* (2011.01)
*G03F 7/20* (2006.01)

(52) U.S. Cl.
CPC ... *G21K 1/06* (2013.01); *B08B 7/00* (2013.01); *B08B 7/0057* (2013.01); *B82Y 10/00* (2013.01); *G03F 7/70166* (2013.01); *G03F 7/70925* (2013.01); *G03F 7/70941* (2013.01)
USPC .................................... 134/1; 134/21; 134/26

(58) Field of Classification Search
None
See application file for complete search history.

(56) References Cited

U.S. PATENT DOCUMENTS

| 6,545,272 | B1 | 4/2003 | Kondo |
| 2002/0051124 | A1 | 5/2002 | Banine |
| 2002/0084425 | A1 | 7/2002 | Klebanoff et al. |
| 2003/0020890 | A1 | 1/2003 | Ogushi |
| 2004/0007246 | A1 | 1/2004 | Chan et al. |

FOREIGN PATENT DOCUMENTS

| DE | 10061248 B4 | 6/2002 |
| DE | 10138284 A1 | 2/2003 |
| JP | 3030315 A | 2/1991 |
| JP | 6151281 A | 5/1994 |
| WO | 02054115 A2 | 7/2002 |
| WO | 2004104707 A2 | 12/2004 |

*Primary Examiner* — Eric Golightly

(57) ABSTRACT

A method of cleaning at least one optical component of at least one irradiation device having at least one radiation source in a vacuum chamber. The source generates in particular extreme ultraviolet and/or soft X-ray radiation whose rays are guided via the optical component onto a workpiece to be treated, during which the optical component is at least partly polluted because of an inorganic substance introduced by the radiation source. A least one reaction partner that is substantially translucent or transparent to the rays is introduced via a feeder device in dependence on the prevailing reaction conditions. The reaction partner reacts chemically with the polluting deposits so as to remove them from the optical component.

11 Claims, 13 Drawing Sheets

METHOD AND DEVICE FOR CLEANING AT LEAST ONE OPTICAL COMPONENT

The invention relates to a method of cleaning at least one optical component of at least one irradiation device which comprises at least one radiation source in a vacuum chamber, which source generates in particular extreme ultraviolet and/or soft X-ray radiation, whose rays are guided via the optical component onto a workpiece to be treated, during which said optical component is at least partly polluted because of an inorganic substance introduced by the radiation source.

Such radiation sources are used in particular for exposing wafers in a lithographic production process. Rays from the radiation source are guided to the wafer via an irradiation device which comprises a very expensive and sensitive optical system, for example monochromators, collector mirrors, and multilayer mirrors. The radiation source is present then together with the optical system, a mask, and the wafer in a single vacuum chamber. This may be necessary because otherwise the rays would be strongly absorbed, for example by lenses, windows, and a plurality of gases.

The radiation source preferably comprises a hot plasma for the generation of rays in the wavelength range from 10 to 20 nm, preferably approximately 13.5 nm, which plasma generates ions which are multiply ionized, for example by electrical discharge or laser pulses, which ions emit rays in the short-wave range.

When an electric discharge device is used, preponderantly inorganic substances are continually introduced into the radiation source or vacuum chamber as a result of a working gas used in this device such as, for example, a metal vapor. In addition, electrode erosion often occurs during discharge operation, owing to which metallic substances of the intrinsically electrically conductive electrode material can enter the vacuum chamber. Inorganic substances are introduced into the vacuum chamber also in the case of laser-induced plasmas, both by an inorganic target that can be excited by a focused, pulsed, high-power laser beam and by the nozzles arranged spatially adjacent the plasma, which nozzles are eroded by a thermal load and/or an ion bombardment originating from the plasma.

These inorganic substances comprise in particular lithium, tin, indium, antimony, tellurium, and/or combinations thereof which are capable of converting energy supplied to the plasma into rays having a wavelength of approximately 13.5 nm in a particularly efficient manner and which are not volatile under the pressure and temperature conditions prevailing in the irradiation device. Said substances migrate from the radiation source towards the optical components, whose reflectivity is considerably reduced in the EUV range by a condensation of the inorganic substance, leading to the formation of surface deposits. In addition, absorption losses will occur owing to the layers deposited on the optical components. The rays are weakened by these two effects to such an extent that their intensity becomes too low for achieving an economically viable throughput of wafers per unit time. Since the deposits on the optical components do not occur in a homogeneously distributed manner on a surface serving for reflection of the rays, the result is an inhomogeneous imprinting distribution of the rays, and finally an uneven irradiation of the wafer.

This problem of deposits on the optical components of an irradiation device is also caused by carbon compounds which may enter the vacuum chamber, for example owing to organic materials such as the vacuum oil and/or the photoresist.

A number of methods and devices are known for the removal of such carbon-containing deposits. Thus, for example, DE-A-100 61 248 suggests a controlled introduction of oxygen into the vacuum chamber so as to achieve an in situ decontamination of an EUV lithography device. A particular disadvantage of this is that the supplied oxygen is capable of decomposing mainly only the carbon-containing deposits by oxidation and that a reaction with the inorganic substances in particular is capable, for example, of forming only metal oxides which have low vapor pressures under the pressure and temperature conditions prevailing in the vacuum chamber. Furthermore, surfaces of a ruthenium mirror and/or a molybdenum layer of a multilayer mirror react irreversibly with the carbon monoxide that is practically unavoidable, under formation of partly volatile metal carbonyls such as $Mo(CO)_6$, resulting in a complete loss of reflectivity.

WO-A-02/054 115 discloses a further device for cleaning a multilayer mirror for use in EUV lithography, wherein an additional protective layer, for example made of ruthenium, rhodium, palladium, iridium, platinum, and/or gold is provided. An optional supply of molecular hydrogen serves to remove effectively only the carbon-containing deposits. In addition, the oxygen-containing reaction partners such as, for example, water molecules absorb the EUV rays to a considerable extent. This obviously reduces the radiation intensity in a particularly disadvantageous manner.

The invention accordingly has for its object to provide a method and a device of the kinds mentioned in the opening paragraphs which achieve a substantially improved removal of mainly inorganic deposits and lead to a longer operational life of the optical components by technically simple means.

According to the invention, this object is achieved as regards a method of the kind mentioned in the opening paragraph in that at least one reaction partner that is substantially translucent or transparent to the rays is introduced via a feeder device in dependence on the prevailing reaction conditions, which reaction partner reacts chemically with the polluting deposits so as to remove them from the optical component.

Of particular importance for the invention here is the recognition that this method can be used both for the laser-induced and for the discharge plasmas. A product formed by the chemical reaction may form, for example, a mobile phase, for example under the prevailing pressure and temperature conditions in the irradiation device, which flows off a surface of the optical component in response to the natural force of gravity.

In order to achieve in particular a high conversion efficiency of energy fed into the radiation source, the method may be improved such that the introduced inorganic substance used is preferably a metal-containing, in particular tin-containing substance.

The comparatively high optical transmission of the supplied reaction partner causes no appreciable absorption of the rays in the EUV range. The method is thus advantageously implemented such that the reaction partner is fed in during operation of the irradiation device. A cleaning of the optical components after switching-off of the radiation source is also possible, for which a dismantling of the optical components arranged in the vacuum chamber is not necessary and a corresponding maintenance time is considerably reduced.

Preferably, the method is implemented such that a selected reaction partner leads to a chemical reaction with the inorganic substance and/or the deposits, which reaction forms a reaction product that is volatile under the prevailing reaction conditions.

Obviously, a volatile reaction product is to be understood to be a compound which has a lower boiling point or a lower sublimation temperature than the inorganic substance. The converted deposits enter the vapor phase and may be readily removed by suction by a pump connected to the vacuum chamber.

To restore the reflectivity of an optical component as quickly as possible in the case of a high deposition rate, the method is implemented such that the reaction partner is selected and fed in with a view to achieving a fast chemical reaction with the inorganic substance and/or the deposits under the prevailing reaction conditions.

A contamination of the optical component can thus be removed instantaneously under all operational conditions of the radiation source.

An advantageous further embodiment of the method provides that a selected reaction partner is fed in so as to achieve a selective chemical reaction with the inorganic substance and/or the deposits. A higher selectivity of the selected reaction partner is capable in particular of avoiding secondary reactions such as, for example, halogenation of other components of the irradiation device, with the result that the operational periods of the mirrors and masks, the vacuum chamber, and the pump are clearly prolonged.

The method is advantageously implemented such that the reaction partner used is, for example, a hydrogen-containing substance and/or a halogen, an interhalogen compound, a halogen-containing compound, and/or a combination thereof. The hydrogen-containing substance which may be, but it is not restricted to molecular hydrogen, hydrogen halide, or ammonia, forms volatile hydrides such as, for example, $H_2Te$ in particular with inorganic substances. Besides elementary fluorine, bromine, iodine, it is in particular chlorine that is to be mentioned among the halogens, because this element can be readily handled in spite its comparatively high reactivity with respect to inorganic substances. Both the interhalogen compound, an example of which to be mentioned here is $ClF_3$, and the halogen-containing compounds, for example $NF_3$, may here be used as alternative fluorine sources.

It is of particular advantage for the method when the reaction partner in the vacuum chamber is converted into radicals by the rays and/or through irradiation by an additional excitation device. These radicals are formed from the classes of compounds mentioned above, for example in situ in the irradiation device upon irradiation in the EUV range. Said additional excitation device may direct, for example, UV light of a suitable wavelength onto the optical component to be cleaned so as to achieve a higher concentration of particularly reactive radicals, whereupon the supplied molecular reaction partner forms radicals.

The method is preferably implemented such that the reaction partner is fed in liquid and/or gaseous form. The selected reaction partner may then be introduced into the vacuum chamber at a small technical expenditure.

A combined supply of gaseous and liquid reaction partners, in addition, renders it possible to generate a comparatively dense mist of droplets of suitable size which are capable, for example, of wetting the optical component for a short period. High concentrations of the reaction partner are thus obtained in the vicinity of the deposits in a limited time and space so as to achieve, for example, a good cleaning of the optical component at a low reaction rate and with a high selectivity.

It is particularly advantageous for the method if the reaction partner is continuously fed in during operation. This leads to constant flow and pressure conditions in the irradiation unit, for example in the case of a continuous supply of the reaction partner. In addition, a chemical equilibrium can establish itself between the reaction partner, the inorganic substance or the deposits, and the reaction products.

The method is advantageously further implemented such that the reaction partner is supplied in doses, for example by means of a pulsed feed-in. In particular if the reaction kinetics are known, a conversion of the deposits initiated by the supplied reaction partner can provide an optimized cleaning rate on the optical components.

The method may be implemented such that the reaction partner is fed in an excess quantity with respect to an introduced quantity of inorganic substance and/or the deposits. The excess quantity of reaction partner is then supplied limited in time and space such that a reaction product is designedly formed with the inorganic substance in dependence on the reaction kinetics of the chemical reaction.

The method is preferably implemented such that the reaction partner is fed in via a dispensing device at a rate which is the chemical equivalent of an introduced quantity of inorganic substance and/or deposits. The dispensing device provides, for example, the pulsed introduction of a reaction partner and considerably reduces the expenditure on material by means of a feed-in of the reaction partner adapted to the reaction kinetics.

The method may furthermore be improved in that the quantity of reaction partner to be supplied is laid down in dependence on an intensity of the rays leaving the optical component, wherein said intensity is determined by means of at least one measuring device. Any measuring device known in the art may obviously be used for this such as, for example, a diode with an adapted filter. It is obviously also possible alternatively to use a measuring device for determining the input of inorganic substance. The latter measuring device measures, for example, the quantity of material directly hitting the optical component.

To enhance the efficiency of cleaning of the optical component further, the method is preferably implemented such that the reaction partner is fed in via a feed line of the feeder device spatially close to the optical component. The additional feed line renders it possible to introduce the reaction partner in a directed manner into the irradiation device.

A particularly favorable method is designed such that the reaction partner is focused on the optical component. A major portion of the supplied reaction partner then hits a fully reflective surface of the optical component, whereby a full conversion of the deposit into a volatile compound can be ensured.

The method may advantageously be further implemented such that the feeder device partitions the reaction partner and supplies it in sectors. Since the optical components are locally differently polluted by the deposits owing to their spatial arrangement in the irradiation device, the partitioning of the reaction partner achieves a better directional supply, and subsidiary reactions, for example with the vacuum chamber, are avoided.

The method may in addition be improved in that the reaction partner is fed into the vacuum chamber via a cooling device and/or a nozzle. In particular gaseous reaction partners can be made liquid by a cooling device or a nozzle that is technically easy to realize with the use of the Joule-Thompson effect so as to ensure a sufficient dwell time of the reaction partner in the irradiation device, i.e. on the surface of the optical components.

A particularly advantageous method of cleaning optical components of an irradiation device is implemented such that at least one optical component is provided with a coating which is substantially transparent to the rays. A transparent coating is understood to be a coating up to a thickness of a few nanometers. Materials eligible for this are, for example, platinum, palladium, gold, ruthenium, nickel, rhodium, or alloys thereof or compounds thereof such as, for example, oxides or nitrides, but also $SiO_2$ or carbon. These coatings then in addition protect the reflecting surfaces of the optical components against the supplied reaction partner.

The method is preferably implemented such that the optical component is heated by a heating device to a temperature ranging from room temperature up to approximately 800° C., preferably to approximately 400° C. A temperature from approximately 50° C. up to approximately 300° C. was found to be particularly suitable for the removal of tin-containing deposits. Since the vapor pressures of the inorganic substance, its deposits, and the reaction products formed therefrom rise with a rise in temperature of the optical components, given the same pressure and temperature conditions in the irradiation device, the deposition of the inorganic substance is reduced and the evaporation rate of the reaction product is increased. Furthermore, a larger selection of reaction products is available which are present at least in liquid form at an increased temperature. Obviously, the temperature of the optical components can only be chosen with due regard to the material properties of the optical components and to reaction equilibria that naturally shift with rising temperatures.

A further embodiment of the invention provides that the cleaning is carried out in an operational pause of the irradiation device without dismantling of individual components. This is called offline cleaning.

It is favorable here if the reaction parameters, temperature and partial pressure, of the reaction partner or the cleaning gases are optimized with a view to a high removal rate of the debris material or with a view to a cleaning that is not detrimental to the material of the optical components.

To achieve that the cleaning can take place even more effectively, for example also by means of overdoses which are detrimental to components not to be cleaned, it is advantageous if components of the irradiation device that are not to be cleaned are protected against contact with the reaction partner or the cleaning gas.

A further embodiment of the invention particularly advantageously provides that the reaction partner is selected in dependence on the reaction with the deposited metal.

To achieve that partial pressures of halogen-containing and/or hydrogen-containing substances are increased only in the respective locations of the desired cleaning and are sufficiently low elsewhere, it is advantageous if the partial pressures of the halogen-containing and/or hydrogen-containing reaction partners are increased only at the respective locations where cleaning is desired.

It is particularly advantageous for this purpose, in particular in the so-called offline operation, if the optical components to be cleaned are separated from the remainder of the vacuum system for the duration of the cleaning process. The result of this is that essentially only the optical components are affected by the reaction partner.

A protection of surfaces that are not to be cleaned may be advantageously achieved in that an inert gas is supplied to regions of the vacuum system which are not to be treated with the cleaning gas, and/or the reaction partner is fed in as a mixture with an inert gas.

A further embodiment of the invention provides that the remaining components with the exception of the optical components are chemically passivated through a local supply of additional reaction gases, or volatile components are converted into non-volatile substances, wherein the reaction gas chosen may be, for example, oxygen or hydrogen.

The measures mentioned above also suppress the release of volatile compounds of components not to be cleaned into the gas phase and an accompanying negative influence on the vacuum quality.

As was described above, the collector can be kept free from metallic deposits by means of the chemical cleaning during operation of a source system with metal operational media. An economically more efficient long-term operation can be achieved when a device for debris suppression is integrated into the system between the radiation source and the collector.

To achieve that the quantity of deposits to be removed can be reduced, accordingly, it is advantageous in a method if the introduced inorganic substances are suppressed by means of a foil trap between the radiation source and the collector.

It is particularly advantageous in this respect if the foil trap is provided with a buffer gas.

It is advantageous for prolonging the useful life of the foil trap if the foil trap is chemically cleaned in a manner analogous to that used for the optical component, but separated therefrom.

It is particularly advantageous here if the cleaning takes place dynamically by means of a flow of the cleaning medium, or statically with the system, in particular the optical components thereof, being closed off.

The cleaning process for the foil trap can be enhanced in that the foil trap is additionally heated.

A further enhancement of the cleaning result is possible if the cleaning partner is introduced exclusively into a partial volume of the vacuum chamber containing the foil trap.

In addition, it is also possible that the foil trap is mechanically cleaned.

In a further embodiment of the invention it is provided that the foil trap or a portion of the foil trap is set into rotation.

To increase the operational life of the optical components of the source module, it is advantageous if a blocking gas of a gas type different to that of the buffer gas of the foil trap is additionally provided in the region of the radiation source and/or the region of the collector.

A further possibility here is that electrical and/or magnetic fields are applied for the suppression of deposits.

It is advantageous for avoiding secondary discharges in the collector space if the foil trap and/or the collector are/is electrically insulated from the vacuum vessel at least during lamp operation.

Since a particularly exact dosage of all contributing components is required for an optimum result in the cleaning process, it is advantageous if the latter is electronically controlled.

A complicated measuring and control system is used for controlling the source module with all components for cleaning of the system in online or offline operation, which system monitors the conditions of the optical components and the systems for the purpose of debris suppression and which initializes and controls the cleaning processes.

An important component of the control system is the continuous measurement of the degree of pollution of the optical components, for example of the collector. The measurement should preferably take place in various locations because the degree of pollution may be dependent on the location, so that also the detection, the process control of the cleaning, and the result checks must take place locally.

A suitable measurement parameter for this is in the first instance the reflectivity of the optical components, at the wavelength of the lithography processes if at all possible, for example the EUV range, and also at the angle of incidence typical of the optical components, if possible. Suitable EUV detectors such as, for example, photodiodes with special filters may for this purpose be moved into the vicinity of the optical components, for example in exposure pauses such as those arising during an exchange of wafers, so as to measure the intensity of the light reflected in various locations of the optical components.

It is also possible to use radiation of different wavelengths such as, for example, visible radiation for measuring deposits on the optical components on the basis of changes in their reflectivity. This is particularly advantageous if no EUV source is available during offline cleaning.

There are further measuring principles which may be used both in online cleaning and in offline cleaning for measuring deposited layers. The presence and thickness of polluting layers can be measured by layer thickness measuring means such as, for example, oscillating quartz elements or ellipsometrical methods.

The electrical surface conductivity of the surfaces of the optical components can be determined by the application of high-frequency AC voltages. This conductivity is material-dependent and gives information on deposits on the surfaces. If the conductivity differences between the surface material and the deposited material are too small, it is possible to provide surfaces of a material having a great conductivity difference (for example insulator materials in the case of metallic impurities) in the vicinity of an optical component with the purpose that these surfaces should become polluted, which surfaces resemble the optical component as regards spatial orientation and surface temperature. Deposits on these measuring surfaces provide direct information on the presence of deposits on the optical component.

A further measuring parameter is a photocurrent which arises in that radiation quanta hitting the surface of an optical component lead to an emission of electrons. Changes in this photocurrent are also sensitive indicators for changes in the surface deposits owing to pollution.

The analysis of the gas phase in the vacuum system in different locations provides valuable information for controlling the chemical cleaning. There are various measuring methods by which this analysis is possible. An example to be especially mentioned here is mass spectrometry. A measurement of the partial pressure composition renders it possible to demonstrate the presence both of the volatile reaction products and of excess reaction gases. This serves on the one hand to optimize the cleaning efficiency. The ratio of partial pressures of reaction product and reaction gas is maximized, for example to reduce the aggressiveness of the cleaning as much as possible. In another example, the partial pressure of the reaction product is maximized to obtain as fast a cleaning as possible. The end of cleaning in the case of offline cleaning can be detected from a decrease in the partial pressure of the reaction product. The selectivity can also be monitored by means of partial pressure measurements in that unwanted reaction products with the material of the optical component are monitored. The vacuum quality may be checked in a similar manner as regards impurities arising from reactions with other components of the vacuum system. Finally, the regeneration cycles of sorption pumps may be controlled by means of partial pressure measurements.

The control of the gas supply of reaction gases may take place by means of valves and flow controls with corresponding flowmeters. The resulting pressure of the reaction gas is checked by means of local partial pressure measurements. A local total pressure measurement suffices in the case of cleaning with an excess of reaction gas. The control system for the gas supply renders possible a choice among different reaction gases, a local distribution of the reaction gases, the admixture of inert gas for reducing the diffusion, and the supply of additional reaction gases for passivating surfaces that are not to be cleaned.

Besides the gas input, the temperatures both of the components to be cleaned and of those not to be cleaned are obviously important control parameters. In addition, the chemical cleaning is controlled by means of the duration of the exposure to the reaction gas.

The object of the invention is furthermore achieved by means of a device for cleaning at least one optical component of at least one irradiation device which comprises in a vacuum chamber at least one radiation source generating in particular extreme ultraviolet and/or soft X-ray radiation and an optical component, which direct rays towards a workpiece to be processed, which optical component may be polluted at least partly because of an inorganic substance introduced by the radiation source, characterized in that a feeder device is present for eliminating deposits which pollute the optical component, which feeder device introduces at least one reaction partner in dependence on the prevailing reaction conditions, which reaction partner is substantially permeable or transparent to said rays and enters into a chemical reaction with the polluting deposits.

This feeder device may be arranged with respect to the irradiation device in particular such that the reaction partner can be supplied in the suction direction of the vacuum chamber upstream of the first optical component and downstream of the radiation source. Obviously, the pollution of the optical components spatially downstream of the radiation source is the highest. An increased concentration of the reaction partner in this region may thus lead to a comparatively high conversion rate to particularly volatile reaction products.

The device is advantageously designed such that a substance comprising a metal, in particular tin, can be used as the inorganic substance introduced. The introduction of substances, for example comprising tin, into the radiation source is capable of achieving a higher effectivity in a conversion of the supplied energy into radiant intensity.

The device may be implemented further such that the reaction partner can be fed in during operation of the irradiation device. It is particularly advantageous here that the supply of the reaction partner can take place in situ and an expensive dismantling of the irradiation device is unnecessary.

A particularly advantageous device is constructed such that a selected reaction partner can be introduced via the feeder device for the purpose of chemically reacting with the inorganic substance and/or the deposits so as to form a reaction product that is volatile under the prevailing reaction conditions. The volatile reaction product is subsequently removed by suction by the vacuum chamber. Alternatively, the reaction product may be collected and removed by a separation device such as, for example, a cooling trap in a suitable location in the vacuum chamber.

The concentration of the inorganic substance and thus the quantity of deposits on the subsequent optical components become lower as the distance to the radiation source increases.

Preferably, the device is constructed such that the reaction partner required with a view to a fast chemical reaction with the inorganic substance and/or the deposits under the prevailing reaction conditions can be selected by means of the feeder device.

The feeder device is for this purpose, for example, internally coated with Teflon so as to be protected from corrosion. The feeder device furthermore preferably comprises a plurality of spatially separated storage containers for providing different reaction partners, which may be switched over within a comparatively short time span as required.

To achieve an effective conversion, the device is advantageously constructed such that the reaction partner necessary for achieving a selective chemical reaction with the inorganic substance and/or the deposits under the prevailing reaction conditions can be selected by means of the feeder device.

This leads to an extreme reduction in particular of the risk of subsidiary reactions taking place between the supplied reaction partners and the components of the irradiation device, mainly the surfaces of the optical components.

The device may for this purpose be further developed such that the feeder device introduces as the reaction partner, for example, a hydrogen-containing substance and/or a halogen, an interhalogen compound, a halogen compound, and/or a combination thereof. In particular molecular hydrogen and the elementary dihalogens chlorine, bromine, and fluorine are comparatively transparent to the rays in the EUV range. The use of fluorine and/or fluorine-containing compounds leads in particular to a natural passivation of the surfaces of the vacuum chamber, whereby they are protected against further corrosion.

A suitable choice of the introduced reaction partner can ensure under the prevailing conditions in the irradiation unit that the polluting deposits react more quickly than, for example, a mirror material such as, for example, ruthenium, rhodium, silicon, and/or molybdenum.

An increased reaction rate can be achieved by means of a further embodiment of the device in that the reaction partner can be converted into radicals inside the vacuum chamber by the rays and/or through irradiation by means of an additional excitation unit. Some reaction partners will obviously be already converted into radicals upon irradiation with EUV light, which radicals, being particularly chemically reactive fragments, can react by preference with the inorganic substance. The excitation device, which is positioned as close as possible to the optical device and generates light of a suitable wavelength or electrical energy, for example in the form of a corona discharge, is capable of strongly enhancing the formation of radicals.

The device is advantageously constructed such that the feeder device provides the reaction partner in liquid and/or gaseous form. In the simplest case thereof, the feeder device may comprise an opening of variable size between the storage container of the reaction partner and the irradiation device. The reaction partner is then as it were sucked into the irradiation unit owing to the prevailing pressure differences between the storage container and the vacuum chamber.

The device is for this purpose suitably arranged such that the reaction partner can be continuously supplied during operation via the feeder device. It should be possible to adapt the supply of the reaction partner both to a degree of pollution of at least one optical component and to at least a reaction rate. The reaction rate is dependent on a kinetic value given by the supplied reaction partner and the deposits.

A preferred embodiment of the device accordingly provides that the reaction partner can be supplied in portions, for example by means of a pulsed input. The portioning of the reaction partner may obviously be achieved by any technique known in the art, for example by means of a pump, Archimedean screw, or disc. This may also relate to a pulsed supply of the reaction partner in which the quantity is optimized by means of a suitable pulse duration of the reaction partner supplied.

The device is preferably constructed such that the reaction partner can be supplied in an excess quantity with respect to an introduced quantity of inorganic substance and/or deposits. The reaction rate may in particular be positively influenced thereby. The excess quantity, however, may be supplied in a temporally and spatially limited manner during this.

A particularly advantageous further embodiment of the invention provides that the reaction partner can be supplied by the feeder device via a dispensing device at a rate of up to the chemical equivalent with respect to an introduced quantity of inorganic substance and/or the deposits. The feed rate of the reaction partner is again mainly controlled on the basis of the previously known reaction kinetics.

The device for cleaning an optical component is preferably constructed such that the quantity of reaction partner to be supplied can be determined in dependence on an intensity of the radiation leaving the optical component, which intensity can be determined by means of a measuring device. The rays may for this purpose be diverted by a movable mirror, for example to a secondary electron multiplier or any other suitable measuring device, for example upon an exchange of the wafer and/or of the mask, so as to determine the reflectivity of an individual optical component or of the entire optical system of the irradiation device. Furthermore, a measuring device may be provided inside the radiation source, which device detects the quantity of inorganic substance directly hitting the optical component so as to determine the quantity of reaction partner to be supplied.

The device is preferably constructed such that the feeder device comprises a feed line spatially close to the optical component. Not only does this simplify the flow guidance of the supplied reaction partner in the irradiation device, but an additional reduction in absorption of the rays by the reaction product can also be achieved thereby.

To ensure an increased concentration of the reaction partner on the optical component, the device is advantageously constructed such that the reaction partner can be focused on the optical component via a or the feed line of the feeder device. In addition, a carrier gas flow, for example of hydrogen or nitrogen, may be used, which blows the volatile reaction product off the reflecting surface of the optical component.

For a more efficient removal of a naturally varying quantity of deposits from the surface of an optical component or the optical components of the optical system, the device may be improved such that the feeder device comprises sectors for partitioning the mass of the reaction partner. The sectors may for this purpose be arranged at the end of the feed line as well as at the branch-off locations of two feed lines, so as to ensure a better distribution of the supplied reaction partner.

To obtain a further increase in the cleaning efficiency, the device may be further developed such that the feeder device comprises a cooling device and/or a nozzle. Especially with such devices, a supply of gaseous reaction products under the conditions prevailing in the irradiation device can achieve a partial condensation on the optical components by cryotechnical measures so as to increase the concentration of the reaction partner further.

A particularly advantageous device is constructed such that at least one optical component has a coating of a material that is substantially transparent to the rays, for example platinum, palladium, gold, ruthenium, nickel, $SiO_2$, or alloys thereof. The coating serves as a kind of covering layer which is to avoid unwanted chemical reactions with the reflector material and which may perform, for example, a catalytic function in the chemical reaction between the deposits and the reaction partner.

For reducing, for example, the condensation of the metallic substance on the optical component, the device is advantageously constructed such that at least one optical component comprises a heating device and/or the components of the vacuum system that are not to be cleaned can be cooled. The heating device renders possible a spatially limited raised temperature, in particular on the surfaces of the optical components. It is especially advantageous here that this inevitable leads to a high evaporation rate of the resulting reaction product. In addition, further suitable reaction partners become available in this case, because their reaction products naturally have higher vapor pressures at higher surface temperatures and are accordingly more easily removed.

A further embodiment of the invention provides that the cleaning can be carried out during an operational pause. This is called offline cleaning.

Furthermore, the device is preferably constructed such that the temperature and/or the partial pressure of the cleaning partner can be adjusted.

It is advantageous for achieving that the number of components affected by the reaction partner can be kept as low as possible during the cleaning operation if the optical components to be cleaned can be separated from the remaining vacuum system by means of movable shutters or through their own movement for the duration of the cleaning process.

A further embodiment of the invention provides that a plurality of inlets for reaction partners are present.

For a better protection of components not taking part in the cleaning, it is advantageous if in addition an inert gas can be supplied in the region of said components and/or the reaction partner in the form of a mixture of reaction partner and inert gas for the purpose of cleaning the optical components.

The protection of the components not taking part in the cleaning, but also of the components that do have to be cleaned, may be enhanced in that the reflecting layers of the optical components, which layers are formed, for example, from ruthenium (Ru), palladium (Pd), rhodium (Rh), molybdenum (Mo), silicon (Si), or beryllium (Be), and the further base layers and retention means consist of or are coated with chemically inert materials such as, for example, ruthenium (Ru), rhodium (Rh), platinum (Pt), gold (Au), nickel (Ni), silicon dioxide ($SiO_2$), or carbon (C).

It is advantageous for reducing initially the quantity of deposits to be removed from the optical components if a foil trap is arranged between the radiation source and the collector.

It is particularly advantageous here if the foil trap can be heated.

A premature replacement of the foil trap can be avoided in that debris material can be removed from the foil trap by means of a suction device.

A further cleaning possibility for the foil trap is found in that debris material can be removed by capillary forces from structures arranged adjacent the foil trap and comprising a porous, foam-type, or wick-type material.

To ensure a directional removal of the debris material removed from the foil trap, it is advantageous if the foil trap or part of the foil trap can be put into rotation.

A defined deposition of the debris material may be advantageously achieved in that a stationary or rotatable catchment device is arranged around the edge of the rotatable foil trap.

A further embodiment of the invention provides that a buffer gas can be supplied through at least one exit nozzle into the space between the collector and the foil trap or into the region of the foil trap itself.

It is particularly advantageous here if a blocking gas can be supplied through a further inlet in the region of the radiation source and/or in the region of the collector.

It is advantageously also possible, however, that the blocking gas is of a gas type different from that of the buffer gas for the foil trap.

The quantity of debris to be removed in the cleaning process may advantageously be reduced beforehand in that devices for generating electric and/or magnetic fields are present.

It is furthermore advantageous if the foil trap can be separated from the remaining vacuum system by means of sealing devices during cleaning.

In a further particularly preferred embodiment of the invention, it is provided that an electrical insulation is present between the foil trap and/or the collector on the one hand and the vacuum vessel on the other hand.

High-precision adjustments of the individual parameters are necessary for the cleaning process. These adjustments may advantageously be obtained by means of an electronic control.

Further advantages and features of the invention will become apparent from the ensuing description of several embodiments given with reference to the drawing, in which:

FIG. 1 diagrammatically shows a device for the irradiation of wafers;

FIG. 2 is a side elevation of an optical component during operation with a second device according to the invention for cleaning a surface of the optical component;

FIG. 3 diagrammatically shows the construction of a source module;

Figure 9:
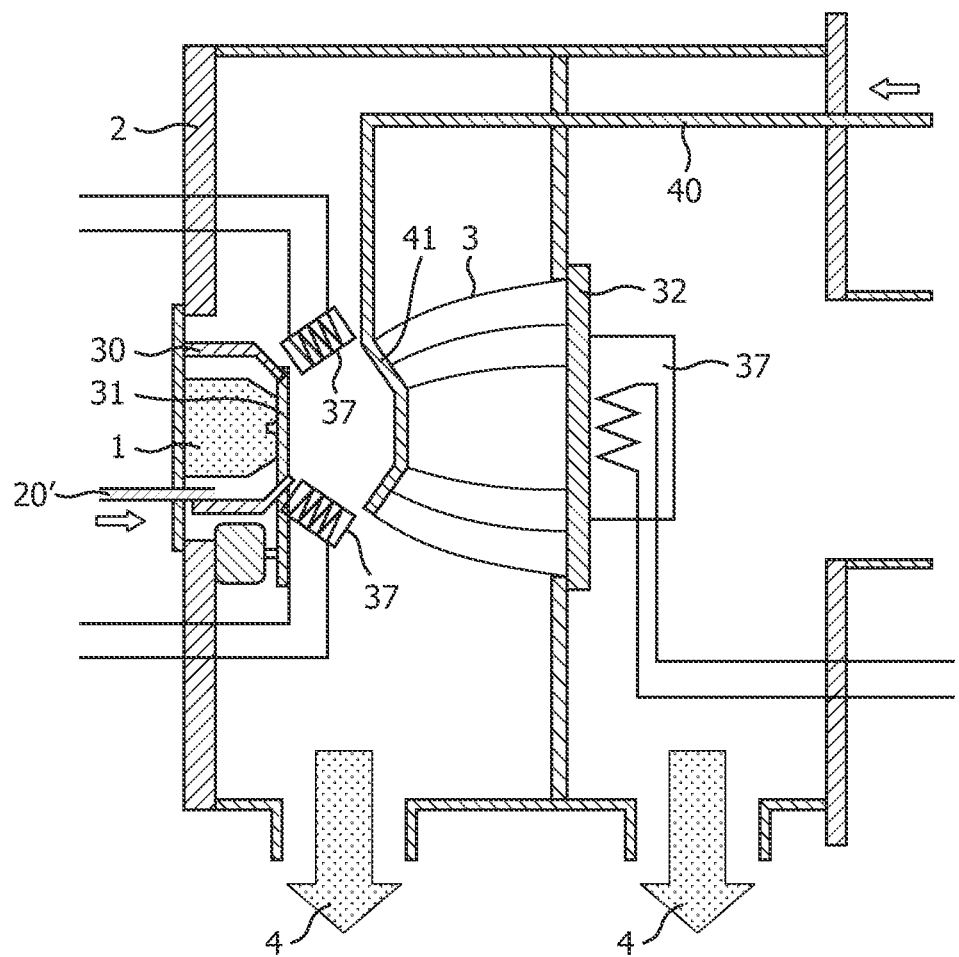
Figure 10:
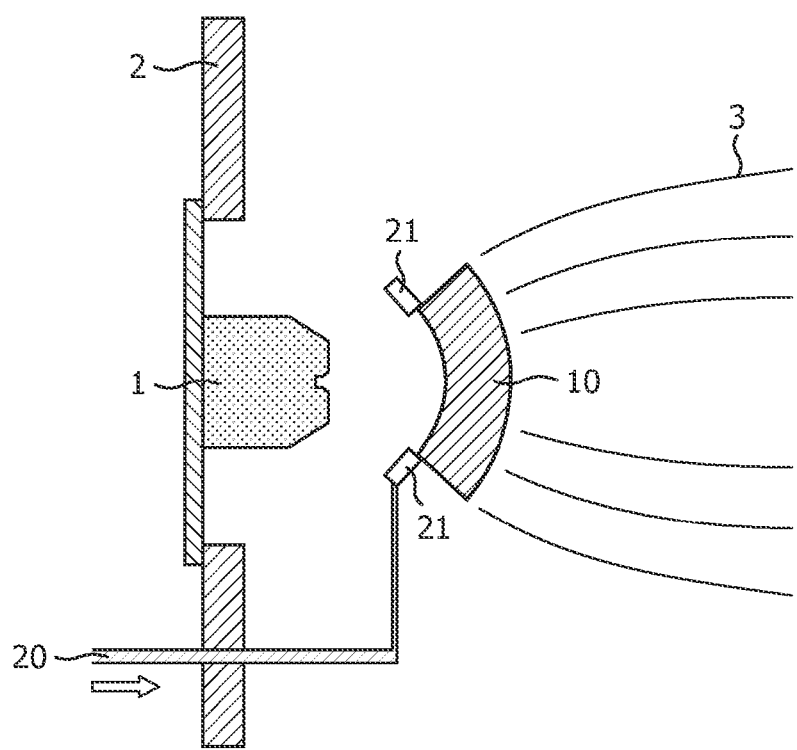
Figure 11:
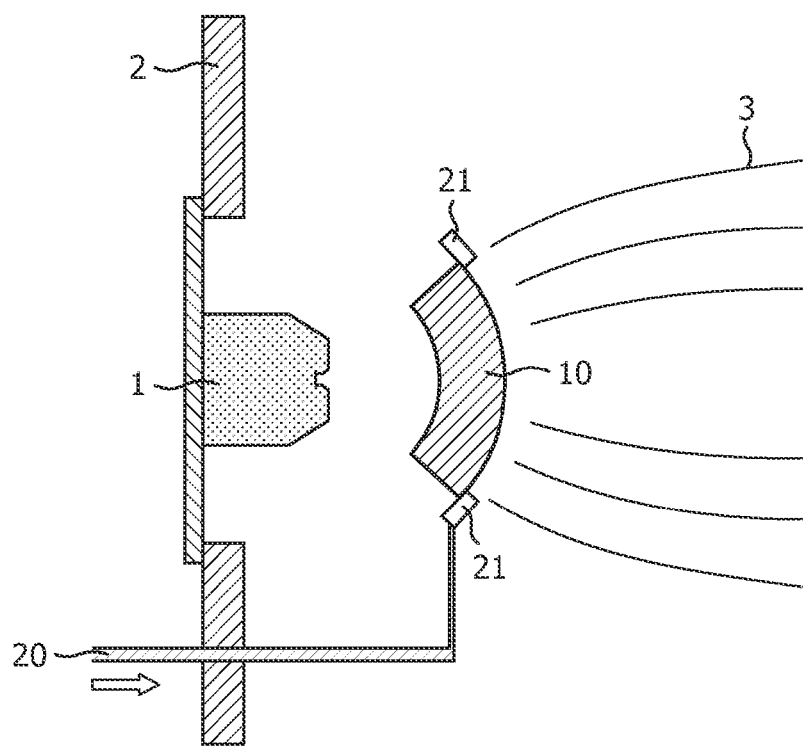
Figure 12:
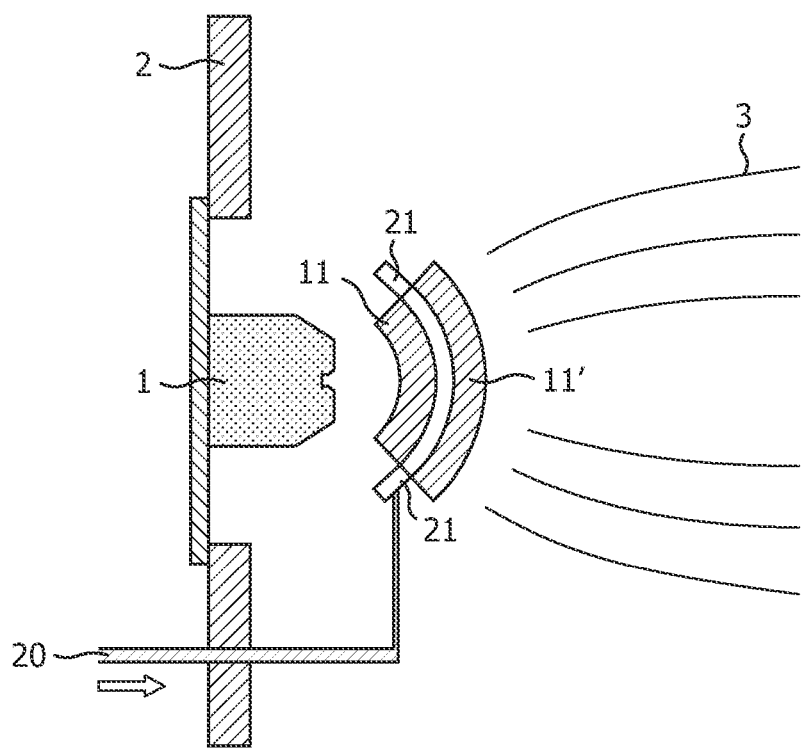
Figure 13:
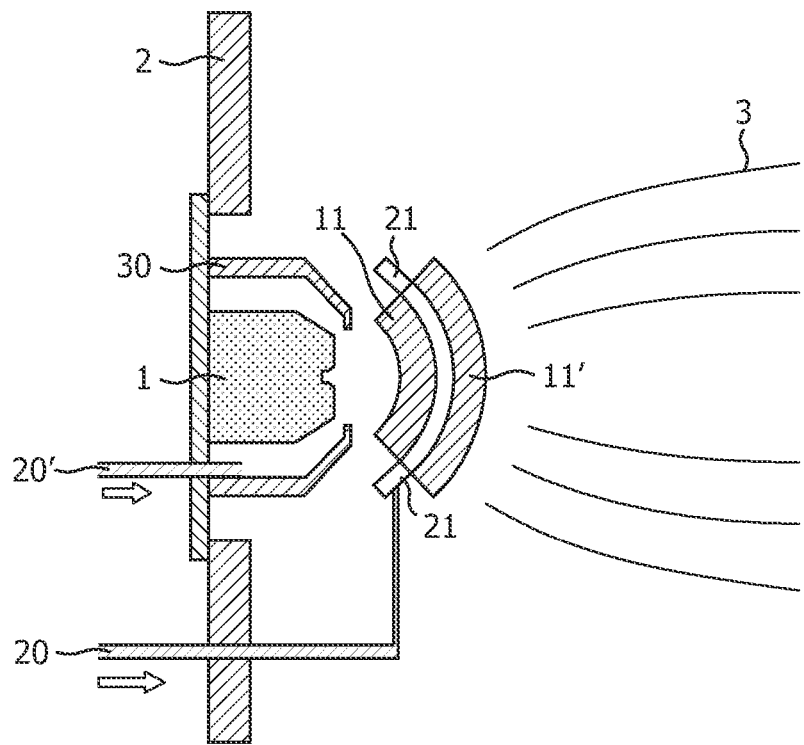
Figure 14:
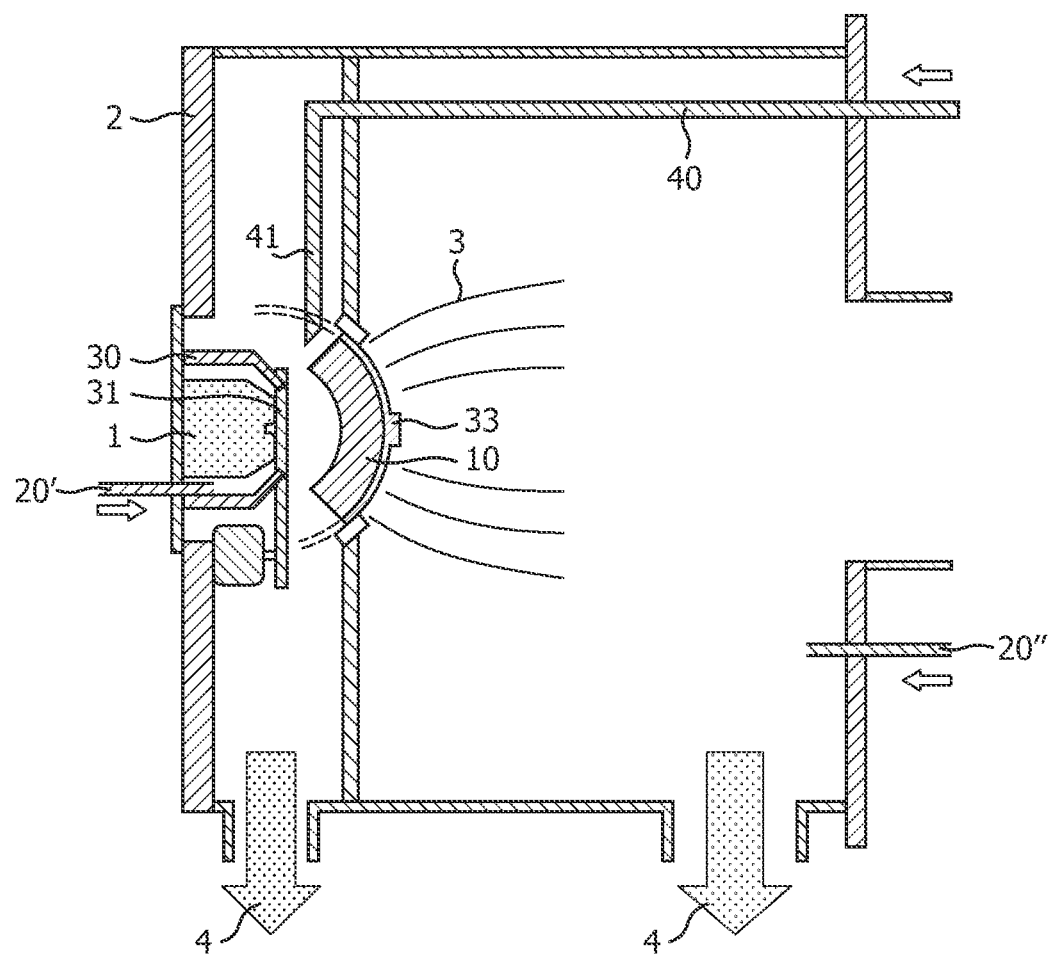
Figure 15:
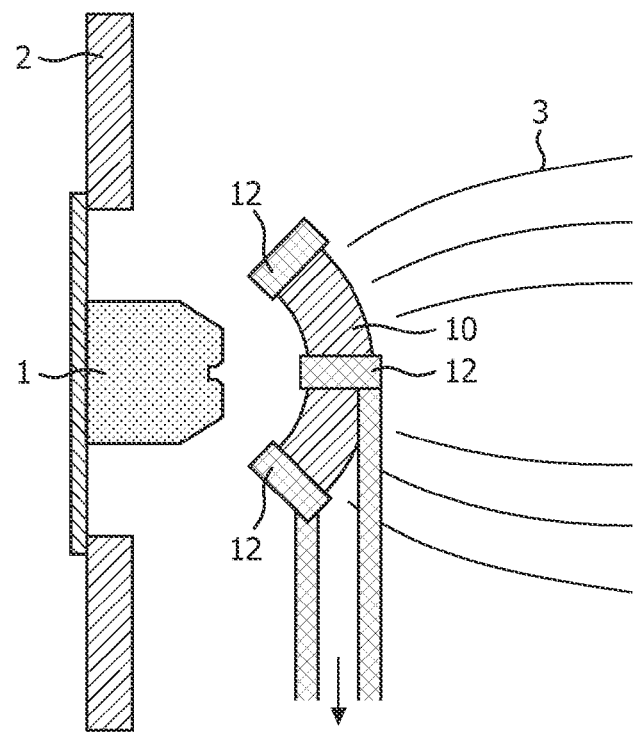
Figure 16:
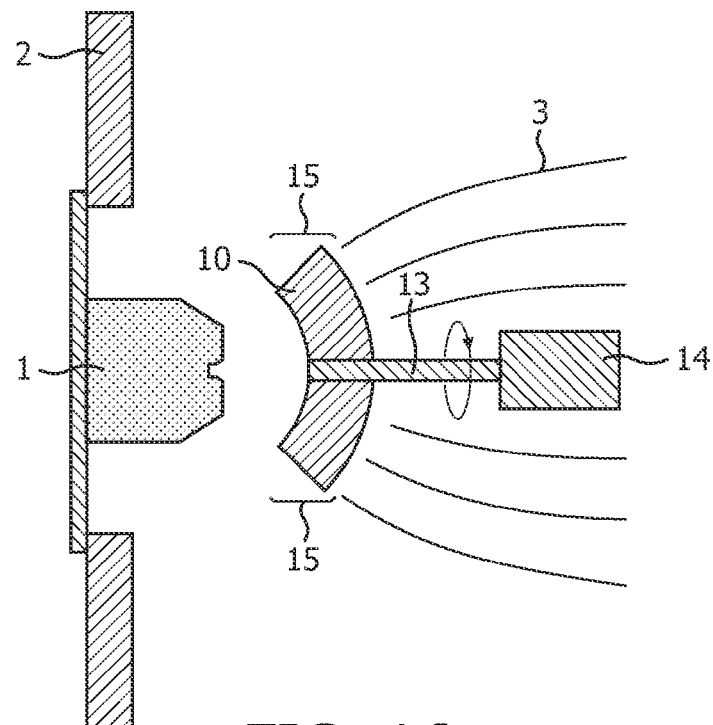
Figure 17:
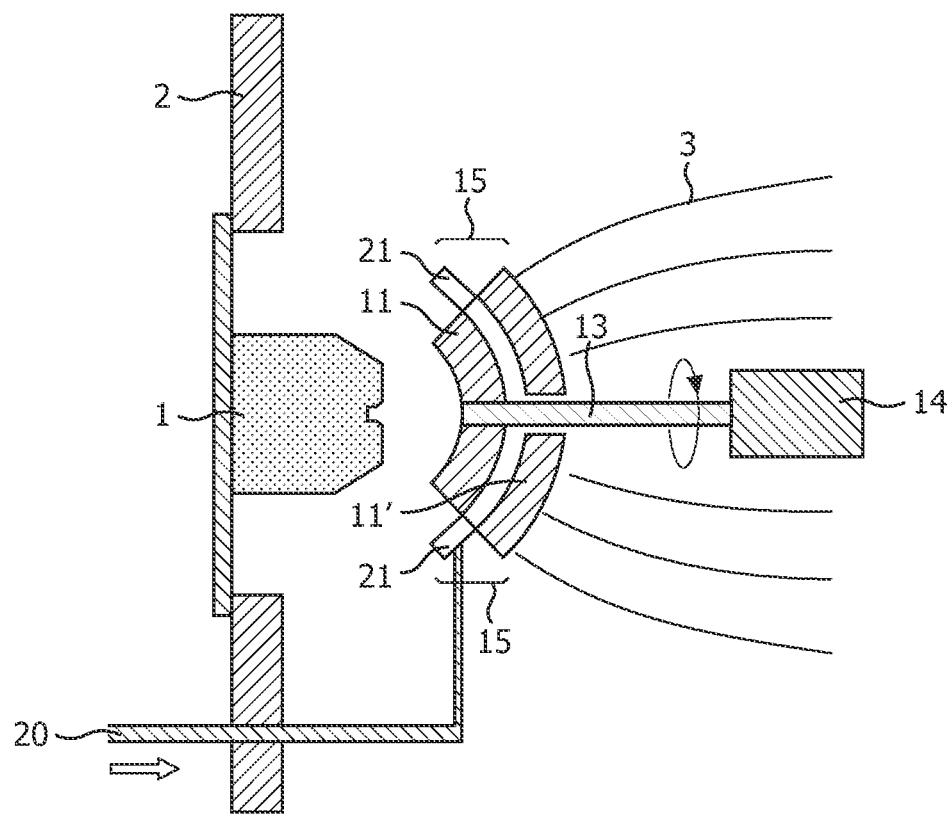
Figure 18:
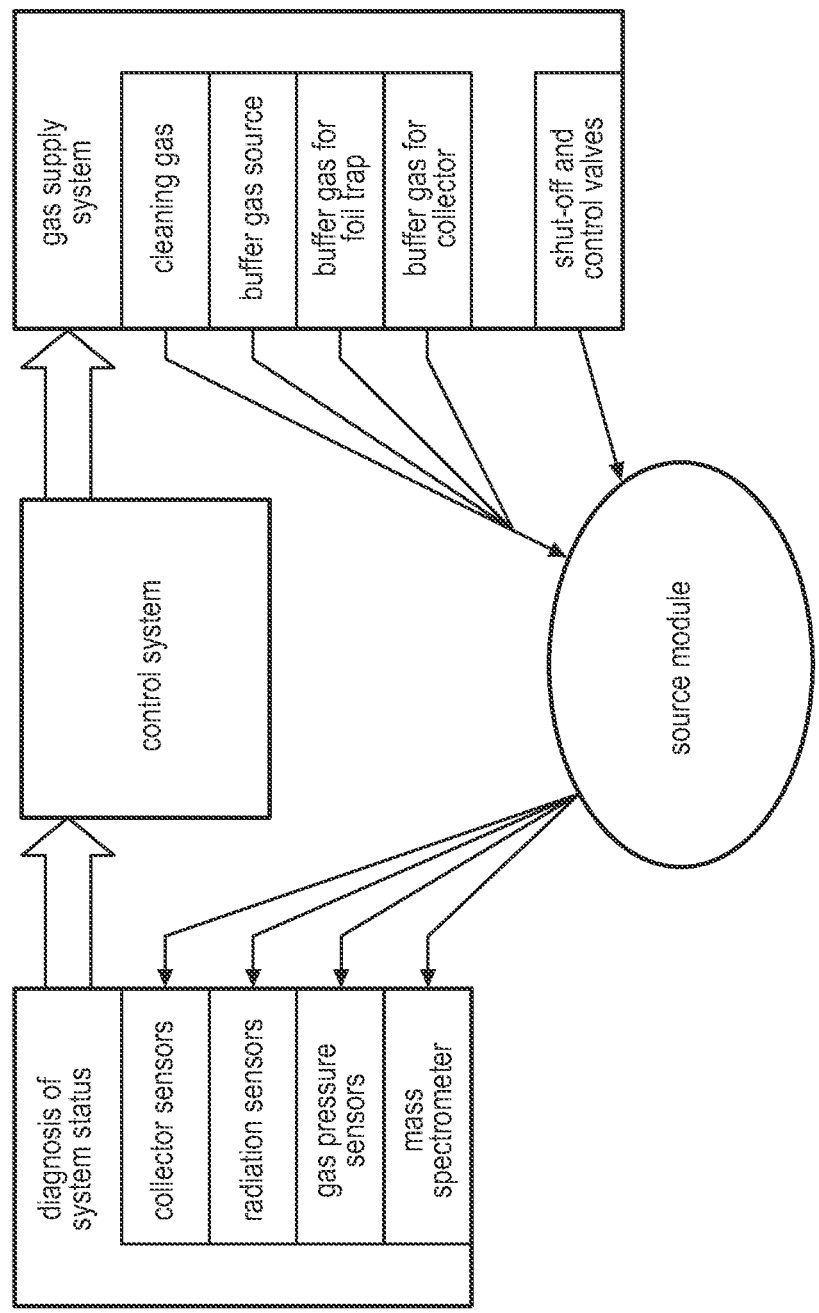

FIG. 9 clarifies the principle of pumping by means of cooling surfaces;

FIG. 10 is a partial elevation with a foil trap;

FIG. 11 is a detailed view with a foil trap;

FIG. 12 is a further partial elevation with a double foil trap;

FIG. 13 is a detailed view with a gas buffer in the EUV lamp;

FIG. 14 is a drawing showing the operating principle of the chemical cleaning of a foil trap;

FIG. 15 shows the principle of mechanical cleaning of a foil trap;

FIG. 16 is a detailed view of a foil trap that can be set into rotation;

FIG. 17 is a detailed view with a foil trap that can be set into rotation and a stationary foil trap; and FIG. 18 is a block diagram showing the control of the cleaning process.

Several embodiments of the invention will now be described with reference to FIGS. 1 to 8. Identical reference numerals always refer to the same constructional features and always relate to all Figures, unless stated to the contrary.

Figure 1:
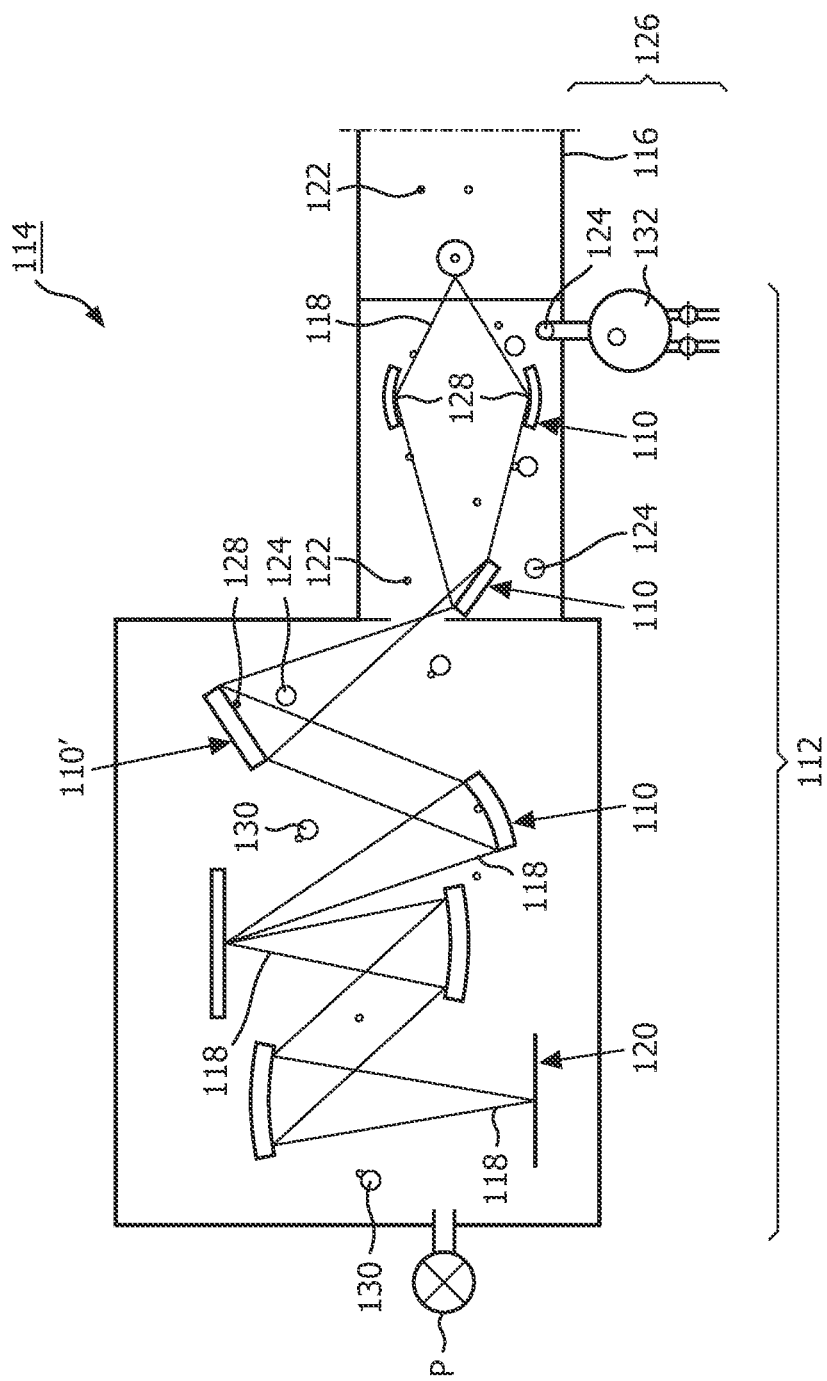

The operating principle of a device for cleaning optical components 110 according to the invention will now be described with reference to FIG. 1, which components are arranged in an irradiation device 112 such that rays 118 originating from a radiation source 116 within a vacuum chamber 114 are guided onto a workpiece 120 to be processed. The radiation source 116 here in particular provides extreme ultraviolet and/or soft X-ray rays which serve for irradiating the workpiece 120, for example a wafer. The rays 118 are generated by a hot plasma inside the radiation source 116 in this case. To generate this plasma, it is possible to use either a working gas such as, for example, a metal vapor that is excitable by means of electric discharge, or a target that evaporates owing to laser beam pulses. In either case, inorganic substances 122, preferably a metallic substance, in particular containing tin, are introduced by the radiation source 116 into the vacuum chamber 114, which substances pollute in particular the optical components 110.

The introduction of a reaction partner 124 which is gaseous and/or liquid under the prevailing pressure and temperature conditions in the vacuum chamber 114 via a feeder device 126 mainly during operation of the irradiation device 112 initiates a chemical reaction, for example with the inorganic substance 122 or the deposits 128 polluting the optical component 110. The deposits 128 are converted into a liquid or volatile reaction product 130 thereby, which product can be removed from the vacuum chamber 114, for example by means of a vacuum pump P arranged to the left of the irradiation device 112 in this Figure. The reaction partner 124 supplied by means of a suitable dispensing device 132, as desired, is selected in dependence on the inorganic substance 122 such that a both fast and selective conversion can take place so as to avoid as much as possible any subsidiary reactions, for example with components of the vacuum chamber 114.

Since the optical components 110 shown here are comparatively close to the radiation source 116, in contrast to the optical components 110', it is advisable to supply the reaction partner 124 between the radiation source 116 and the optical components 110, since it is in this region that a higher deposition rate of the inorganic substance 122 may be expected.

Eligible reaction partners 124 are in particular hydrogen-containing substances and/or halogens, interhalogen compounds, halogen compounds, and/or a combination thereof. Of these, for example, the element chlorine has a low absorption for EUV rays and readily forms highly reactive chlorine radicals in the vacuum chamber 114. The chlorides formed in the chemical reaction often have substantially higher vapor pressures here and accordingly lower boiling points than the inorganic cations contained therein. Thus, for example, elementary tin boils at approximately 2687° C. under normal conditions, whereas under the same conditions $SnCl_2$ boils at approximately 605° C. and $SnCl_4$ already at approximately 114° C. The reaction partner 124 is continuously fed in, in particular during operation of the radiation source 116, so as to remove any contamination of the optical components 110 by means of the process described here. This feeding-in may be controlled so as to be continuous as well as pulsatory, so that the supply takes place in dependence on the previously determined reaction kinetics. The supply of the reaction partner takes place in a spatially and temporally limited manner in an excess quantity or up to the chemical equivalent of the quantity of inorganic substance 122 introduced by the radiation source 116 in order to achieve a full conversion.

Figure 2:
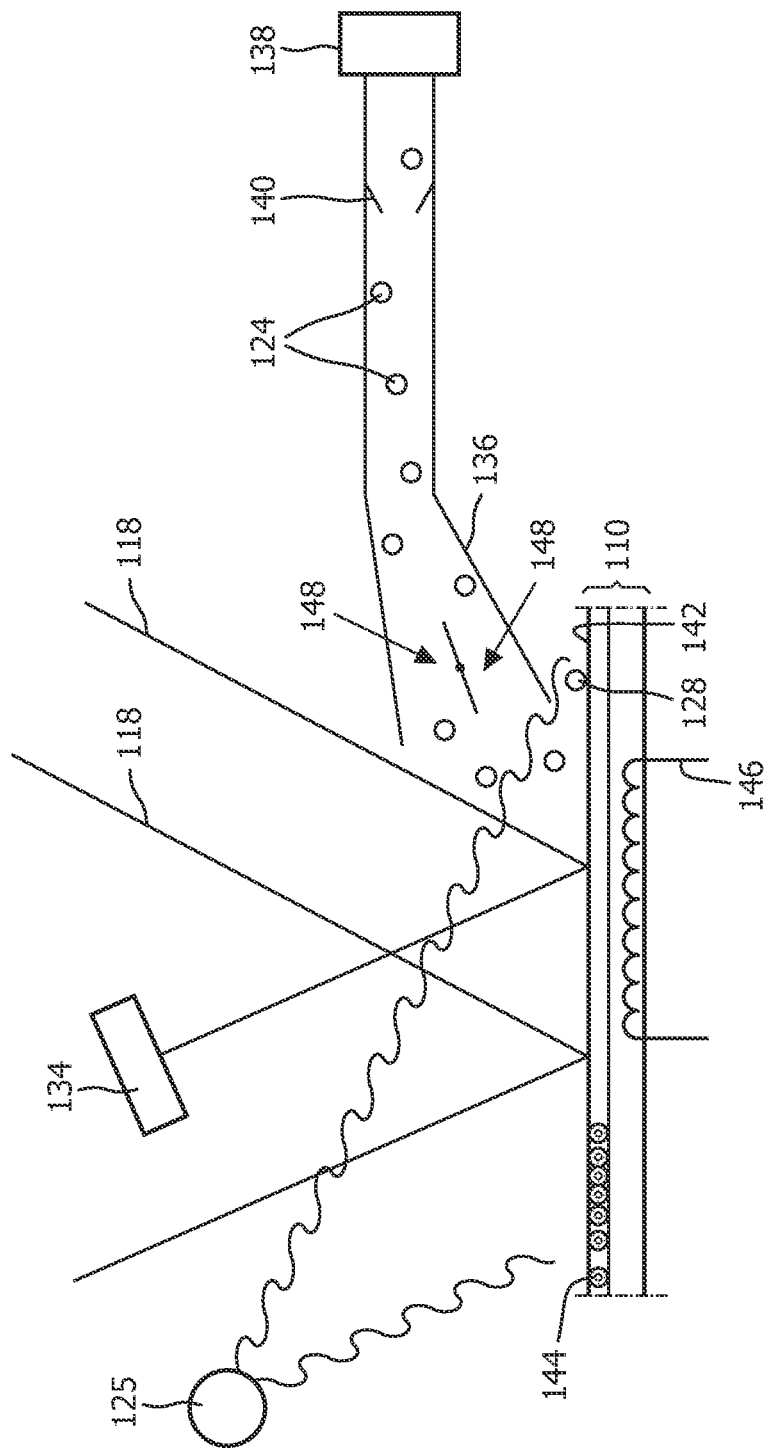
Figure 3:
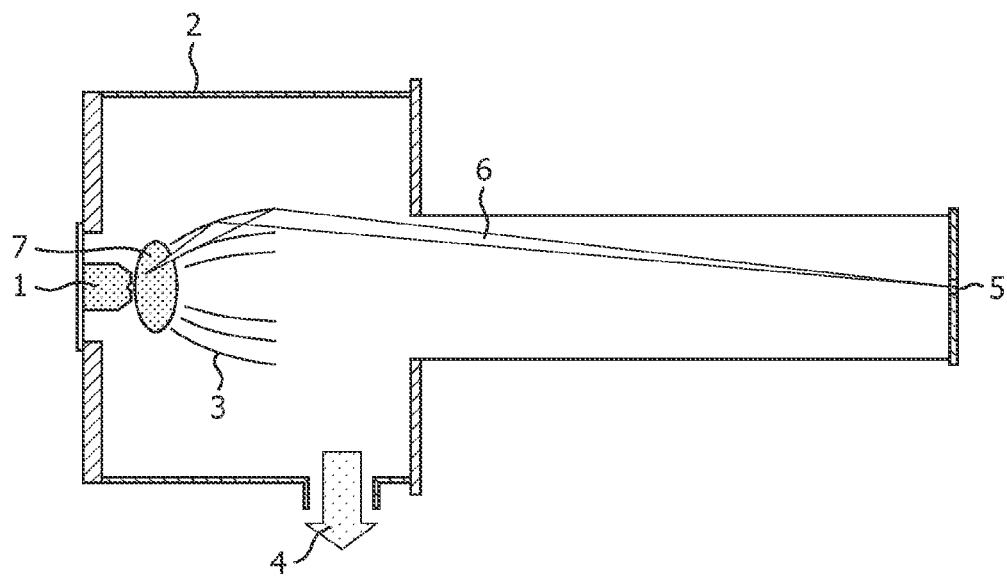
Figure 4:
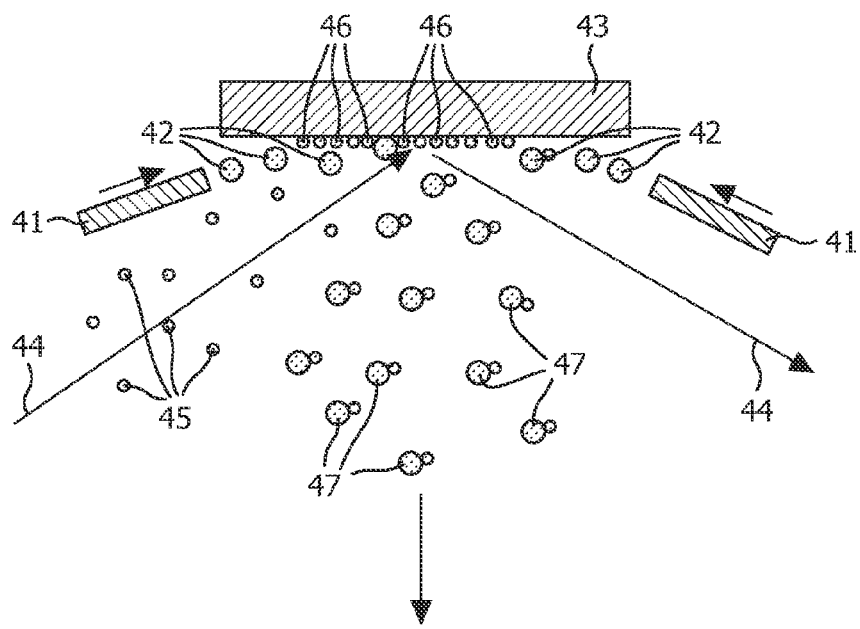
FIG. 4 shows the principle of the chemical cleaning process.

As is shown in FIG. 2, a measuring device 134 is used, for example, so as to be able to supply the optimum quantity of reaction partner 124 in a controlled manner. This measuring device 134 may detect, for example, the intensity of the rays 118 reflected by the optical component 110. This takes place preferably whenever a mask and/or a wafer 120 is to be replaced during the lithographic process.

The reaction partner 124 can be focused in a spatially restricted manner and in a high concentration onto a reflecting surface of the optical component 110 through the feed line 136 shown here. A higher reaction rate between the deposits 128 and the reaction partner 124 can be achieved thereby.

The concentration of the reaction partner 124 may be additionally increased in that in particular gaseous reaction partners 124 are liquidized by an additional cooling device 138 or by the use of cryotechnical measures such as the Joule-Thompson effect via a nozzle 140 so as to wet the polluted surface for a limited time period.

Furthermore, the reaction partner 124 may be converted into chemically particularly reactive radicals by means of an additional excitation device 125 shown here, for example by irradiation with high-energy light, so as to increase the reaction rate further.

Subsidiary reactions caused by the wetting of the surface of the optical component 110 by the reaction partner 124 may be further reduced by an additional coating 142 that is substantially transparent to the rays. This coating comprises a material 144 which contains, for example, the transition metals platinum, palladium, ruthenium, rhodium, gold, or alloys and compounds thereof, for example oxides or nitrides, or alternatively silicon dioxide or carbon. These are capable of supporting, for example catalytically, the envisaged conversion of the deposits 128 by means of the reaction partner 124. Alternative coating materials are also possible, however, which will be described further below.

A heating device 146, for example integrated with the optical component 110 as shown here, generates a temperature of approximately 20° C. to 800° C., preferably 400° C., for example by means of ohmic resistance heating. A temperature rise leads to a higher evaporation rate in most cases under discussion here, as is generally known. Since a contamination of the surface of the optical component 110 by the deposits 128 varies in dependence on its arrangement in the irradiation device 112, as is shown in FIG. 1, the concentration of the reaction partner 124 may be adapted as required through a subdivision into sectors 148 within the feed line 136.

Further embodiments of the invention will now be described with reference to FIGS. 3 to 18. The debris particles 45 emitted during operation of the source or lamp 1 form an undesirable deposit or deposited debris particles 46 on the optical component 43, for example a mirror, which reflects EUV radiation 44 or EUV light originating from a radiation source 1. Selective chemical reactions on the surface of the optical component 43 with a reaction partner or cleaning gas 42 supplied through a local inlet or nozzle 41 converts the condensed deposits 46 into volatile substances or reaction products 47. The latter evaporate and can be removed by pumping. For this purpose, the fed-in reaction partners are chosen such that they form compounds with the condensed metals whose vapor pressures lie above the ambient partial pressures of the metal compounds at the temperature of the optical component 43.

The selection of the chemical reaction partners 42 is based first of all on the reaction with the deposited metal. A reaction which is as fast as possible should lead to a volatile product. A further criterion is a good optical transmission of the reaction partner 42 in the EUV range, so that the presence of the chemical reaction partner 42 does not appreciably reduce the EUV intensity. Finally, the reaction should be selective, i.e. the reaction partner 42 should react effectively with the condensed impurities or deposits 46, whereas a reaction with the materials of the optical component 43 should be as weak as possible.

Suitable reaction partners 42 are halogens such as $Cl_2$, $Br_2$, $F_2$, $J_2$, their atomic radicals, and compounds comprising these halogens. They lead to the formation of volatile metal halides. Suitable are also hydrogen and hydrogen compounds. To achieve the selectivity, the reaction conditions, such as the temperature and concentration of the supplied reaction partner 42, should be chosen such that the compound with the pollutant, for example tin chloride, is formed much faster than a compound with a mirror material such as, for example, ruthenium chloride. The conditions can be controlled in this manner such that the impurities are removed before any appreciable attack on the mirror material can take place.

Figure 5:
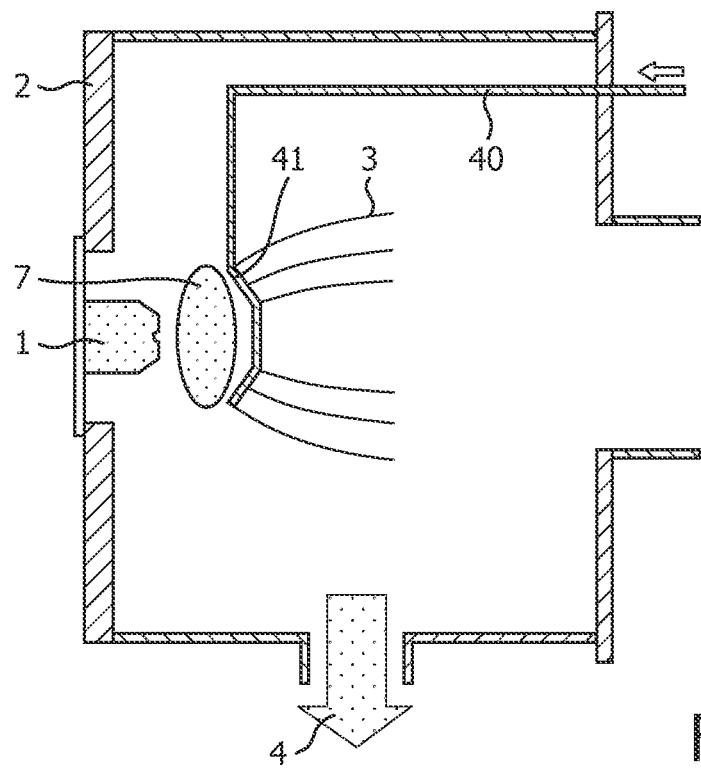
FIG. 5 is a diagram for the chemical online cleaning.

Cleaning may take place during operation of the EUV equipment, the so-called online cleaning as shown in FIG. 5. The object here is to introduce so much halogen or hydrogen locally at a certain temperature of the optical component 43 that the quantity of deposited material exactly corresponds to the quantity of the reacting and evaporating material. The reflectivity of the optical component 43 remains constant in that case. The presence of the EUV radiation 44 leads to the formation of halogen or hydrogen radicals, which enhances the reactivity. On the other hand, volatile metal compounds thus formed may also partly dissociate again and recondense, which reduces the net rate of the removal. These radiation-dependent changes in the rate of removal, however, may be compensated by the gas dosage. In this cleaning mode, the gas inlet, for example the cleaning gas inlet 40 or the nozzles 41, and the pumping arrangement are constructed such that the partial pressures of halogen-containing and hydrogen-containing substances are always increased exclusively in the locations where cleaning is desired and are sufficiently low elsewhere, so that the operation of the illumination unit is not interfered with and the useful lives of other components are not affected.

Figure 6:
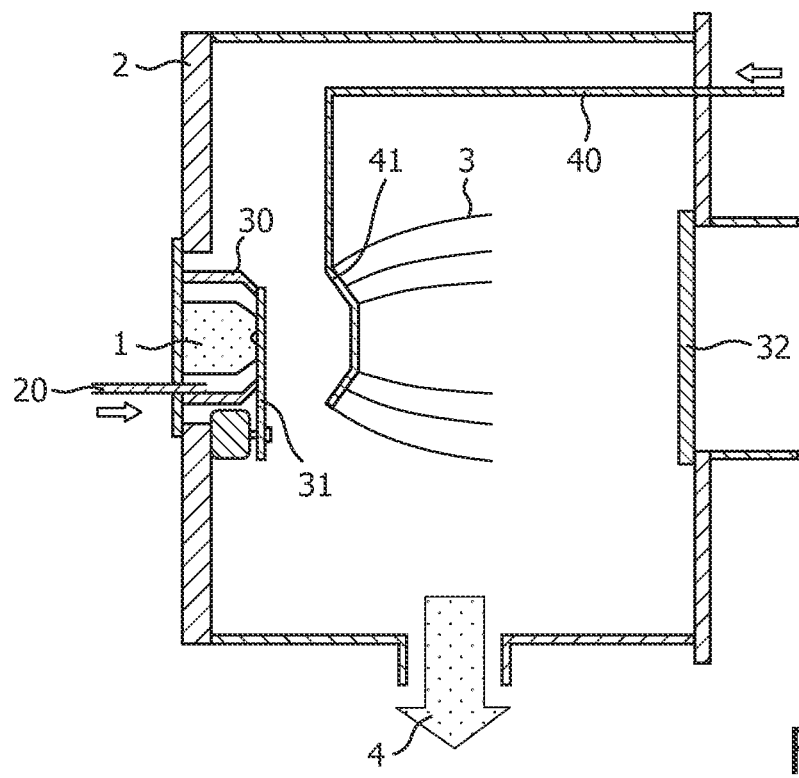
FIG. 6 is a diagram for the chemical offline cleaning.

Cleaning may alternatively take place in operational pauses, the so-called offline cleaning shown in FIG. 6, in which case the polluted optical components 43 remain inside the equipment, so that no dismantling with corresponding long down times is necessary. Instead, the cleaning cycles can be kept very short through a suitable choice of the parameters.

To achieve this, the optical components to be cleaned, for example the collector optics or the collector 3, may be separated from the remaining vacuum system by means of movable closing members such as a lamp housing 30, lamp closure 31, a collector closure 32, or shutters for the duration of the cleaning process. The cleaning cycle speed can be optimized through the choice of temperature and partial pressure of the reaction gas without the necessity of taking into account the components in the remaining vacuum system. After the reaction products have been pumped from the closed-off cleaning region, the closing members 30, 31, 32 are opened again, and the operation of the irradiation unit can be resumed.

The introduction of the reaction gas or cleaning gas 42 takes place preferably in the vicinity of the optical component 43 to be cleaned and is directed towards the latter. Ideally, the surface to be cleaned constitutes the first wall against which the reaction gas 42 hits after leaving the feed line. Individual regions of the optical component 43 may be exposed to mutually different partial pressures of the reaction gas by means of a plurality of local gas inlets, in the case in which an inhomogeneous pollution obtains. The volatile reaction product formed on the surface of the optical component 43 to be cleaned and any excess reaction gas 42 are pumped off.

The mean free path length between gas collisions can be reduced, and accordingly the diffusion of reaction gas or also of reaction products into other regions of the vacuum system can be prevented or at least slowed down through the addition of an inert gas into regions of the vacuum system which are not to be treated with the cleaning gas 42, or through the addition of the reaction gas in the form of a mixture with an inert gas. The major portion of the reaction product and of the residual reaction gas 42 can thus be pumped off by means of an effective pumping system before it reaches other components of the vacuum system.

In offline cleaning during operational pauses, the optical component 43 to be cleaned is preferably separated from the remaining vacuum system by means of closures 30, 31, 32. The reaction gas 42 thus reaches only a closed-off space. The closed-off space can be exhausted very effectively so as to achieve the required gas phase composition again quickly after cleaning has been completed. Then the closures 30, 31, 32 or valves can be opened again, and the operation of the irradiation device can be resumed.

As is shown in FIG. 6, it is possible, for example, to close off the source module at its output side by means of a suitable plate valve or closure 32. The radiation source 1 may be screened off by a lamp housing 30 and a movable closing device 31. It is provided here that the penetration of the reactive cleaning gas 42 is additionally prevented by the supply of an inert gas or buffer gas 20.

Figure 7:
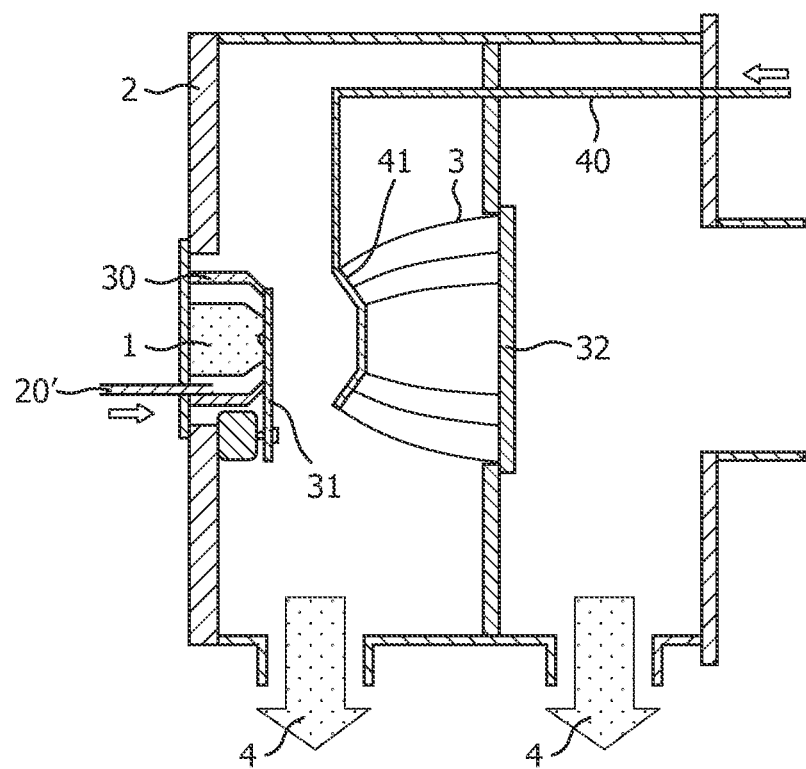
FIG. 7 is a cross-sectional view of a device with a valve at the collector output.

Various further embodiments for the arrangement and separation of the cleaning volume may be used for the offline cleaning FIG. 7 shows how the closure 32 at the output side is directly arranged at the output of the collector 3. In addition, a separation is provided into two pumping spaces at the input and output sides of the collector 3. The volume (or surface) coming into contact with the cleaning gas 42 is considerably reduced thereby.

Figure 8:
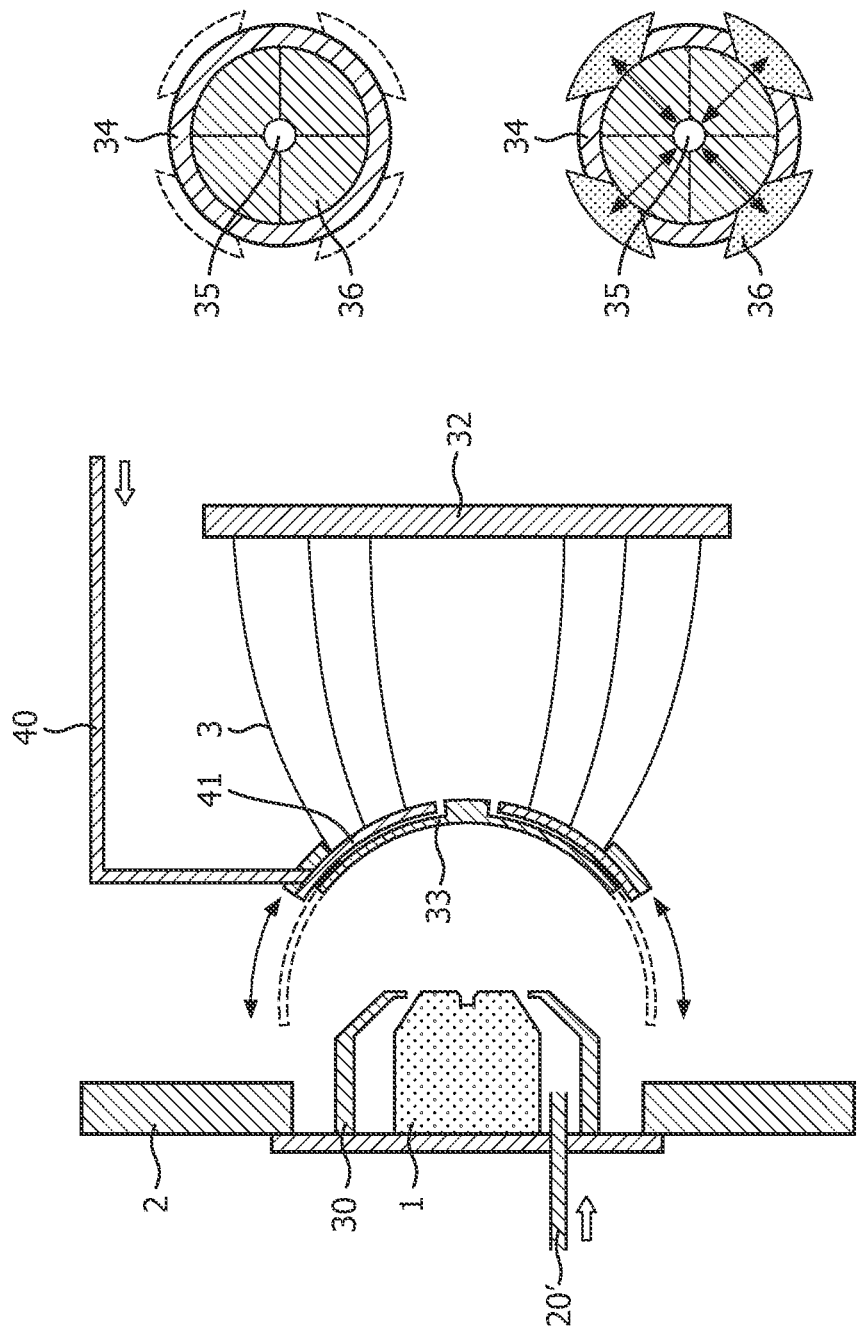
FIG. 8 is a partial cross-sectional view of a device with a valve at the collector input and output.

A further reduction of the cleaning volume can be achieved by means of a closing device 33 at the collector input, as shown in FIG. 8. Here the closure 33 is formed by several segments 33c which are moved sideways during operation of the source 1, thus fully clearing the optical radiation path 6. This construction occupies very little space and also serves as a closure of the collector space in the presence of a debris suppression system such as, for example, a foil trap 10.

The closed-off volume is either connected to high-power pumps via lines of large diameter, or the closing walls around the optical component 43 to be cleaned themselves constitute an effective pump. This is possible by means of an integration of cooled surfaces into the closing walls, which surfaces are cold enough for causing both the reaction product and any excess reaction gas 42 to condensate substantially completely. The cooling surfaces with the condensed substances are transported into other vacuum containers via vacuum locks after cleaning, where they are heated and the evaporating substances are pumped off. The sorption by cooling surfaces may be combined with a more effective chemical sorption (for example by means of activated carbon) obtained by means of a suitable coating, if so desired, as is known in the art of vacuum technology.

In online cleaning during operation, the locally regulated gas inlet operates permanently, and reaction products and excess reaction gases are to be pumped off continuously. High pumping throughputs in the vicinity of the optical components 43 to be cleaned may again be realized by means of large pumping diameters and/or local thermal or thermochemical sorption. The sorption surfaces must be regenerated in alternation periodically behind vacuum locks in continuous operation.

Regions which the reaction products or excess reaction gases 42 are not allowed to enter, such as the EUV light source 1, the foil trap 10, optical components 43, and which are not resistant to the cleaning gases 42 in use, i.e. the mask and wafer region lying beyond the intermediate focus, may be protected by differential pumping stages and directional counterflows with an EUV-transparent inert gas. Especially rare gases such as, for example, helium are very favorable for this, because it is inert and comparatively transparent to EUV light. In addition, the local sorption surfaces may be arranged such that they do not pump, for example, helium and are thus less quickly saturated, so that they have to be regenerated. Alternative gases may be similarly used, for example hydrogen and nitrogen.

The chemical cleaning takes place selectively, so that the metallic impurities are removed without the optical component 43 reacting with the introduced cleaning gas 42. This is achieved through a suitable choice of reaction gas 42 and of reaction conditions such as temperature and partial pressure of the reaction gas. The parameter range available is widened by a suitable material choice for the optical components 43. The choice of EUV-reflecting layers is limited to materials such as Ru and Pd in the case of mirrors for grazing reflection, owing to the high reflection requirements, and is limited to Mo, Si, and Be for mirrors with perpendicular reflection, but the base layers and support structures offer a wider freedom. Chemically inert materials such as, for example, Ru, Pt, Au, Ni, or $SiO_2$ may be used for this.

It suffices here to cover the parts of the optical component 43 with a thin coating of a chemically inert material such as, for example, Ru, Rh, Pt, Au, Ni, or alloys or compounds thereof such as, for example, oxides or nitrides, but also $SiO_2$ or C, and thus to protect these components against reactions. For protection of the reflecting upper layer, the coating of the inert material is chosen to be so thin that it affects the optical properties to a low degree only.

The reaction rate of the condensed metals and the evaporation rate of the reaction products is controlled by means of the temperature of the optical component. On the other hand, it also influences possible reactions between the material of the optical component 43 and the added reaction gases 42, so that the selectivity of the reaction is influenced via the temperature.

A suitable heating of the component enhances the cleaning by means of selective chemical reactions. The speed with which the metal compounds are formed in heterogeneous surface reactions rises with the temperature of the surface. The vapor pressure of the metal compounds thus formed also rises with the temperature. Since the criterion for evaporation is that the vapor pressure of the compound should be higher than the partial pressure of the compound in the surroundings, a larger number of compounds fulfills this criterion at a higher temperature. In addition, the evaporation rate is determined by the vapor pressure above the surface and the thermal speed. Both rise with a rise in temperature, so that a higher temperature leads to a faster evaporation rate.

Possible unwanted reactions with the collector material, however, also become more important with a rise in temperature, because the reaction speed and the volatility of the products also rise here with the temperature.

It is accordingly an object within the scope of the invention to set the temperature of the optical component 43 by means of heating or cooling devices such that a sufficient removal rate of metal impurities is achieved in combination with a negligibly weak attack of the optically relevant surfaces.

Limiting factors for the temperature are also the material properties of the optical component 43 the temperature resistance of the entire system, and the temperature dependence of the chemical reaction equilibrium. If temperatures are too high, the reaction equilibrium tends to move away from the metal compound towards the initial products.

Vacuum containers or other components present in vacuum are protected against the reaction gases 42 and reaction products during offline cleaning in operational pauses. In online cleaning during operation, components not to be cleaned may also come into contact with the reaction gases and the reaction products. This could lead to a chemical attack on the surfaces and could form volatile products which lead to undesirable substances being freed into the gas phase.

To prevent this, the gas inlet and pumping schedule are arranged such that the partial pressures of the reaction gases are increased only adjacent the components to be cleaned. In addition, the vacuum containers themselves and other components are protected in that they are kept at temperatures which lie below the temperatures of the components to be cleaned. Suitable cooling devices are provided for this purpose. Low temperatures reduce the reactivity strongly, so that the chemical substance conversion rate already reduced by the lower partial pressures is even further reduced. Low temperatures in addition lead to low vapor pressures of the reaction products, so that very little enters the gas phase.

If a reduction of the temperature and of the partial pressure of the reaction gas is not sufficient in itself, further measures may be taken for protecting the components. Ideally, the components are manufactured from chemically inert materials or are at least coated therewith. Another possibility is the choice of reactive materials whose reaction products are not volatile at the prevailing temperatures, so that the reaction products remain at the surface and thus chemically passivate the latter.

Finally, surfaces may be passivated also by the local addition of further reaction gases, or volatile substances may be converted into non-volatile substances. The addition of oxygen can convert metals, present already or deposited, into metal oxides. The latter are usually chemically more stable than metal halides, so that a further formation of metal halides through reaction with the cleaning gas 42 is prevented thereby. In addition, the metal oxides thus formed are usually not easily volatilized, so that they remain as passivating surface layers and do not affect the gas phase.

If volatile reaction products originating from the cleaning of the hotter optical components condense on the colder components, for example metal halides, these will evaporate slowly because of the lower temperatures and will contaminate the gas phase for a longer period, depending on the temperature-dependent vapor pressure. This can be prevented by the addition of oxygen, so that metal oxides not tending to volatilize are formed, which do not enter the gas phase and passivate the surface. The halogen evolved thereby, which is also volatile at low temperatures, may then be quickly pumped off.

Hydrogen may also be added as an additional reaction gas. The volatile halogen-hydrogen compound arising in the chemical reaction is quickly pumped off, while the heavy, pure metal remains behind. In contrast to the addition of oxygen, however, the passivation does not take place here, since the pure metal, unlike its oxide, can react again with a halogen under formation of a metal halide.

As was described above, the collector 3 can be kept free from metal deposits by means of the chemical cleaning during operation of a source system with metal operating media. An economically more efficient long-term operation can be achieved if a device for debris suppression is integrated in the system between the radiation source 1 and the collector 3.

A very effective system for debris suppression is the foil trap 10 mentioned further above. A typical arrangement for a foil trap 10 is shown in FIG. 10. The main components of the foil trap 10 are: a) a plurality of thin foils or lamellae which are arranged such that the light emitted by the radiation source 1 is intercepted as little as possible, while on the other hand narrow channels are created which catch particles propelled obliquely with respect to the lamellae and absorb them at least for a short period, and b) a buffer gas 20 provided through a gas supply nozzle, which deflects incident debris particles from their trajectories by means of gas collisions and thus prevents their uninterrupted flight through the channels between the lamellae.

Alternative embodiments of a foil trap are shown in FIGS. 11 and 12. In FIG. 11, the supply of the buffer gas 20 takes place from the collector 3. This is advantageous if the partial pressure of the buffer gas in the location of the radiation source 1 must not be too high. In FIG. 12, an intermediate solution, with respect to the pressure distributions of FIGS. 10 and 11, is shown with a two-part foil trap 10.

Here the problem arises, however, in particular with radiation sources 1 which use solid or liquid working media under normal conditions—for example metals or metal salt solutions—that deposits of the working medium occur in the narrow channels of the foil trap which lead to obstructions and thus to a loss of EUV radiation 4 after a short period.

The quantity of the deposits in the foil trap 10 here is a multiple of the quantity deposited on the collector 3. The more effective the foil trap 10 in suppressing undesirable particles, i.e. binding them at its surface, as is indeed envisaged, the higher the quantity of deposits relative to the deposits on the collector 3.

This problem may be solved in various ways.

One solution proposed is to regenerate the foil trap 10 chemically in a manner similar to that described above for the collector 3. Since much larger quantities of deposits are to be removed from the foil trap 10 in comparison with the collector 3, higher doses of the cleaning gas 42, i.e. pressure and/or effective period, are to be used, or the cleaning process must take place at a higher temperature.

The following embodiments of the chemical cleaning process for a foil trap 10 are suggested in detail below:

1. Cleaning through introduction of an increased dose of the cleaning medium 42 into the total vacuum vessel. This is possible if all structural materials of the source module, in particular of the collector, are resistant to the increased cleaning dose. The process may take place as an online cleaning during operation of the source or as an offline cleaning.
2. The process may be carried out dynamically under a flow of the cleaning medium 42 or statically with the system fully sealed off.
3. As sub 1 and 2, with additional heating of the foil trap, for example electrically or by means of infrared radiation. Cleaning of the foil trap 10 becomes possible then at substantially smaller doses of the cleaning medium 42.
4. Introduction of the cleaning medium 42 into a partial volume of the vacuum vessel which contains the foil trap 10 but not the collector 3, possibly in combination with 2, if so desired.
5. Arrangement as sub 3, wherein the separation between the foil trap 10 and the collector 3 is achieved by means of a mechanical shutter 33 between the foil trap 10 and the collector 3.
6. Arrangement as sub 3, wherein the separation between the foil trap 10 and the collector 3 is achieved by means of two mechanical closures, at the input and at the output of the foil trap.
7. Arrangement as sub 3, wherein the radiation source 1 is excluded from the chemical cleaning by means of an additional closure member 30, 31.
8. Arrangement as sub 3, wherein the separation between the foil trap 10 and the collector 3 is achieved by a mechanical displacement of the foil trap 10 into a cleaning chamber which is separate from the main vacuum vessel. The cleaning is carried out therein in a manner analogous to 2 and/or 3, followed by a return to the operational position.

Another possibility for cleaning the foil trap 10 may be used if the trapped debris material 45 is present in liquid form on the hot lamellae of the foil trap 10 during operation of the source 1. This is the case, for example, with the use of tin as the operational medium in the radiation source 1.

The liquid operational medium will flow either towards the axis of symmetry or towards the lower edge of the foil trap under the influence of gravity. Here it is removed by suction.

The following embodiments are suggested in detail, as is visible, for example, from FIG. 15:

1. Active suction by a pump or suction device 12.
2. Removal by capillary forces. Porous, sponge-type, or wick-type structures may be used, which absorb the material and transport it away from the foil trap 10.
3. Arrangement of the devices as sub 1, 2, on the axis of the system (optical axis).
4. Arrangement of the devices as sub 1, 2, at the edge of the foil trap 10.
5. Arrangement of the devices as sub 1, 2, in locations of the foil trap which correspond to those regions in the optical beam path which are shaded by further system components. No additional light losses are caused by the suction device itself then.

A further possibility for cleaning the foil trap 10 may also be used if the trapped debris material 45 is present on the (hot) lamellae of the foil trap 10 during operation of the source 1. This is the case, for example, when tin is used as the operation medium in the radiation source 1.

The cleaning problem can then be solved in that the foil trap 10 is made to rotate during operation, cf. FIGS. 16 and 17. The liquid material deposited on the lamellae of the foil trap 10 is then propelled radially outwards by the centrifugal forces and is thus removed from the lamellae of the foil trap 10. The radial acceleration is given by $$a_r = r \cdot \omega^2$$

Given typical radii in a range of around, for example, 5 cm, a rotation frequency of 7 revolutions per second already achieves a radial acceleration of 10 g=98.1 m/s². Liquid deposits can be propelled substantially fully outwards thereby except for possibly a thin film adhering to the foils.

A further advantage of the use of a rotating foil trap 10 is that larger debris droplets 45, which have comparatively low velocities, are caught by the rotation of the lamellae of the foil trap 10 and can thus be removed. Given a length L of the rotating foil trap 10 and a width B of the channels in circumferential direction, droplets with a maximum velocity of $$v_{max} = \omega \cdot r \cdot L/B$$

can still be removed. A maximum speed of the retained particles of 22 m/s results from typical values of r=5 cm, L/B=10 at a rotation frequency of 7 revolutions per second.

The rotating foil trap 10 acts as a pump at a higher rotation frequency, achieving a gas transport mainly in radial direction. This has an influence on the density distribution of the buffer gas 20 used in the foil trap 10. In addition, the flow conductance of the trap structure for an axial throughflow with the buffer gas 20 is also changed.

The following embodiments of a rotating foil trap are suggested in detail:

1. Rotation of the entire foil trap 10 about an axis of rotation 13 by means of a motor 14, cf. FIG. 16.
2. Rotation of only part of the foil trap 10, for example in the form of a two-stage foil trap 10 as shown in FIG. 17.
3. A circular catchment member or ring 15 rotating along with the trap for catching the radially accelerated material and removing it in a defined manner.

4. A circular, static ring 15 arranged around the rotating foil trap 10 and designed for catching the radially ejected material and removing it in a defined manner.

5. Arrangement of the buffer gas supply on the axis of rotation of the foil trap 10 such that as homogeneous as possible a density distribution of the buffer gas 20 is obtained in dependence on the rotation frequency of the foil trap 10 and taking into account the radial pump action. This is achieved through a suitable choice of the axial outflow positions in the regions of the lamellae and the gas flows.

6. Arrangement of the buffer gas supply in the space between the collector 3 and the foil trap 10 in positions corresponding to regions in the optical beam path which are shaded by further system components. No additional light losses are thus caused by the suction device itself. The arrangement and the gas flows are chosen such that as homogeneous as possible a density distribution of the buffer gas 20 is obtained in dependence on the rotation frequency of the foil trap 10 while taking into account the radial pump action.

The embodiments described above for chemical cleaning and operation of a foil trap 10 may be combined with other measures for prolonging the operational life of the optical components of the source module:

Additional supply of a blocking gas 20' of a gas type different from that of the buffer gas 20 of the foil trap 10 in the region of the radiation source 1. This leads to a counterpressure in the region of the source 1 and to a reduction in the gas flow from the foil trap 10 or 11 and 11' (FIG. 13) to the source 1. The partial pressure of the foil trap buffer gas in the location of the radiation source 1 is reduced thereby. This is advantageous if the operation of the radiation source 1 is possible only at a low partial pressure of the foil trap buffer gas 20. Blocking gases to be used may be, for example, hydrogen, nitrogen, helium or other rare gases, possibly also in mixtures.

Additional supply of a blocking gas of a gas type different from that of the buffer gas 20 of the foil trap 10 in the region of the collector 3. This leads to a counterpressure in the region of the collector and to a reduction in the gas flow from the foil trap 10 or 11 and 11' to the collector 3. The partial pressure of the foil trap buffer gas in the collector space is reduced thereby. This is advantageous if the radiation-absorbing action of the foil trap buffer gas can be avoided by means of a less absorbing gas in the collector space. The gases mentioned in the preceding paragraph may be used.

Debris suppression by means of electric or magnetic fields. Charged particles may be deflected thereby and guided into non-detrimental regions of the system.

Electrical insulation of the foil trap 10 and/or the collector 3 with respect to the vacuum vessel. Secondary discharges in the collector space can be prevented thereby, which could otherwise lead to damage to reflection layers owing to sputtering.

A complicated measuring and control system as shown in FIG. 18 is used for controlling the source module with all components for cleaning of the system in online or offline operation, which system monitors the condition of the optical components 43 and of the systems for debris suppression and initializes and controls the cleaning processes.

An important component of the control system is the continuous measurement of the degree of contamination of the optical components, for example of the collector. The measurement should take place in several locations by preference, because the degree of contamination may be dependent on location, so that also the detection, the process control of the cleaning, and the result checks must take place locally.

A suitable measuring parameter for this is first of all the reflectivity of the optical components, as far as possible at the wavelength of the lithography process, for example the EUV range, and if possible also at the angle of incidence typical of the optical components. Suitable EUV detectors, for example diodes with special filters, may for this purpose be moved into the vicinity of the optical components 43, for example during exposure pauses such as those occurring upon an exchange of wafers, so as to measure the intensity of the light reflected in various locations of the optical components.

It is alternatively possible to use radiation of different wavelengths such as, for example, visible radiation so as to measure deposits on the optical components 43 from changes in reflectivity. This is particularly advantageous if no EUV source is available in the case of offline cleaning.

There are further measuring methods which may be used both for online cleaning and for offline cleaning for the measurement of deposited layers. The presence and thickness of contaminating layers can be measured by layer thickness measuring methods such as, for example, with oscillating quartz elements or alternatively ellipsometric methods.

The surface conductivity of the surfaces of the optical components can be determined through the application of high-frequency AC voltage to said surfaces. This conductivity is material-dependent and provides a clue to the presence of surface deposits. If the conductivity differences between the surface material and the deposited material are too small, surfaces of a material having a great conductivity difference (for example insulating material in the case of metallic contaminations) may be provided for contamination purposes in the vicinity of an optical component, resembling the optical component in spatial orientation and surface temperature. Deposits on these measuring surfaces provide direct evidence as to deposits on the optical component.

A further measuring parameter is a photocurrent which arises in that radiation quanta incident on the surface of an optical component cause the emission of electrons. Changes in this photocurrent are also sensitive indicators for changes in the surface occupation by contaminating substances.

The analysis of the gas phase in the vacuum system in different locations supplies valuable evidence for controlling the chemical cleaning. There are various measuring methods by which this analysis is possible. An example that may be mentioned here is first of all mass spectrometry. A measurement of the partial pressure composition can show both the volatile reaction products and excess reaction gases. This serves on the one hand to optimize the cleaning efficiency. The ratio of the partial pressures of the reaction product and the reaction gas is maximized, for example in the case of a cleaning that is as unaggressive as possible. In another example, the partial pressure of the reaction product is maximized for as fast a cleaning as possible. The end of the cleaning process in the case of offline cleaning is indicated by a decrease in the partial pressure of the reaction product. The selectivity can also be monitored by measurement of the partial pressures, in that unwanted reaction products caused by reactions with the material of the optical component are monitored. Similarly, the vacuum quality can be checked as regards contamination owing to reactions with other components of the vacuum system. Finally, the regeneration cycles of sorption pumps can be controlled via the partial pressure measurements.

The control of the gas supply of reaction gases may take place by means of valves and flow control units with associated flowmeters. The resulting pressure of the reaction gas is checked by means of local partial pressure measurements then. A local total pressure measurement suffices in the case of cleaning with an excess quantity of reaction gas. The control system for the gas supply renders possible a choice of various reaction gases, the local distribution of the reaction gases, the admixture of inert gas for reducing the diffusion, and the supply of additional reaction gases for passivating surfaces which are not to be cleaned.

Besides the supply of gases, the temperatures are obviously also important control parameters both for the components to be cleaned and for those not to be cleaned. In addition, the chemical cleaning is controlled by means of the duration of exposure to the reaction gas.

The method and the device for cleaning optical components achieve a considerably improved removal of deposits and a longer useful life of the optical components.

LIST OF REFERENCE NUMERALS 1 lamp
2 vacuum reservoir
3 collector
4 tubular line to pump
5 intermediate focus
6 example of optical beam path
7 system for debris suppression
10 foil trap
11 double foil trap
12 suction device
13 axis of rotation
14 motor
15 catchment for removed debris material
20 buffer gas supply
20' blocking gas
21 exit nozzles for buffer gas
30 lamp housing
31 lamp closure
32 collector-side closure
33 closure between foil trap and collector
34 mounting ring and outer sealing surface
35 central piece and inner sealing surface
36 movable closure segments
37 cooling device
40 cleaning gas supply
41 exit nozzles for cleaning gas
42 cleaning gas
43 optical component, for example reflector
44 EUV radiation
45 debris particles
46 deposited debris particles, debris material
47 volatile reaction products
110 optical component
112 irradiation device
114 vacuum chamber
116 radiation source
118 rays
120 workpiece
122 inorganic substance
124 reaction partner
125 excitation device
126 feeder device
128 deposits
130 reaction product
132 dispensing device
134 measuring device
136 feed line
138 cooling
140 nozzle
142 coating
144 material
146 heating device
148 sectors
P vacuum pump

The invention claimed is:

1. A method of cleaning during a cleaning process at least one optical component an irradiation device which comprises at least one radiation source in a vacuum chamber, wherein the method comprises the acts of:
   generating by the at least one of source extreme ultraviolet radiation and soft X-ray radiation having rays;
   guiding the rays via the at least one optical component onto a workpiece to be treated, during which said at least one optical component is at least partly polluted because of at least one inorganic substance introduced by the radiation source forming polluting deposits on the at least one optical component; and
   introducing in the vacuum chamber at least one reaction partner that is substantially translucent or transparent to the rays from a dispensing device via a feeder device in dependence on prevailing reaction conditions in the vacuum chamber,
   wherein the reaction partner is configured to react chemically with the polluting deposits so as to remove the polluting deposits from the at least one optical component,
   wherein the introducing act introduces the reaction partner one of in an excess quantity with respect to a pollutant quantity of at least one of the at least one inorganic substance and the polluting deposits and at a rate of up to a chemical equivalent of the pollutant quantity, and
   wherein the at least one reaction partner comprises a halogen.

2. The method as claimed in claim 1, further comprising the act of focusing the reaction partner on the at least one optical component.

3. The method as claimed in claim 1, further comprising the act of protecting components of the irradiation device that are not to be cleaned against contact with at least one of the reaction partner and a cleaning gas (42).

4. The method as claimed in claim 1, further comprising the act of separating the at least one optical component to be cleaned from remainder components in the vacuum chamber for a duration of the cleaning process.

5. A method of cleaning during a cleaning process at least one optical component an irradiation device which comprises at least one radiation source in a vacuum chamber, wherein the method comprises the acts of:
   generating by the at least one of source extreme ultraviolet radiation and soft X-ray radiation having rays;
   guiding the rays via the at least one optical component onto a workpiece to be treated, during which said at least one optical component is at least partly polluted because of at least one inorganic substance introduced by the radiation source forming polluting deposits on the at least one optical component;
   introducing in the vacuum chamber at least one reaction partner that is substantially translucent or transparent to the ray from a dispensing device via a feeder device in dependence on prevailing reaction conditions in the vacuum chamber; and
   suppressing the inorganic substances by a foil trap between the at least one radiation source and a collector.

6. The method as claimed in claim 5, wherein the foil trap includes a buffer gas, the method further comprising the act of providing a blocking gas in a region of at least one of the radiation source and the collector, wherein blocking gas of a gas type different from the buffer gas of the foil trap, and wherein the blocking gas comprises at least one of hydrogen, nitrogen, and helium.

7. The method as claimed in claim 5, wherein the suppressing act comprises applying at least one of electrical and magnetic fields.

8. The method of claim 1, wherein at least one of the generating and introducing acts is electronically controlled and regulated.

9. The method as claimed in claim 8, further comprising the act of measuring a degree of contamination of the at least one optical component, wherein the measuring act is performed one of intermittently and continuously.

10. The method as claimed in claim 9, wherein the measuring act is performed in several locations.

11. The method of claim 5, wherein the reaction partner is configured to react chemically with the polluting deposits so as to remove the polluting deposits from the at least one optical component,
  wherein the introducing act introduces the reaction partner one of in an excess quantity with respect to a pollutant quantity of at least one of the at least one inorganic substance and the polluting deposits and at a rate of up to a chemical equivalent of the pollutant quantity.

* * * * *